United States Patent
Takagi et al.

(10) Patent No.: US 7,030,388 B2
(45) Date of Patent: Apr. 18, 2006

(54) ILLUMINANT, AND, ELECTRON BEAM DETECTOR, SCANNING ELECTRON MICROSCOPE AND MASS SPECTROSCOPE EACH INCLUDING THE SAME

(75) Inventors: Yasufumi Takagi, Hamamatsu (JP); Minoru Niigaki, Hamamatsu (JP); Shoichi Uchiyama, Hamamatsu (JP); Minoru Kondo, Hamamatsu (JP); Itaru Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/679,517

(22) Filed: Oct. 7, 2003

(65) Prior Publication Data

US 2004/0129891 A1 Jul. 8, 2004

(30) Foreign Application Priority Data

Oct. 9, 2002 (JP) ............................ P2002-296560

(51) Int. Cl.
*H01J 37/244* (2006.01)
(52) U.S. Cl. ............... 250/397; 250/399; 250/492.2
(58) Field of Classification Search ............... 250/397, 250/399, 492.2, 492.3
See application file for complete search history.

(56) References Cited

U.S. PATENT DOCUMENTS

| 5,684,309 | A | * | 11/1997 | McIntosh et al. ............ 257/191 |
| 5,998,925 | A | * | 12/1999 | Shimizu et al. ............. 313/503 |
| 6,384,519 | B1 | * | 5/2002 | Beetz, Jr. et al. .... 313/103 CM |
| 6,399,966 | B1 | * | 6/2002 | Tsuda et al. ................ 257/103 |
| 6,580,215 | B1 | * | 6/2003 | Nihashi ....................... 313/542 |
| 6,614,059 | B1 | * | 9/2003 | Tsujimura et al. .......... 257/101 |
| 6,674,098 | B1 | * | 1/2004 | Niki et al. ................... 257/102 |
| 2002/0074553 | A1 | * | 6/2002 | Starikov et al. .............. 257/77 |
| 2003/0173578 | A1 | * | 9/2003 | Schaff et al. ............... 257/103 |
| 2004/0061054 | A1 | * | 4/2004 | Kondo et al. ............... 250/310 |

FOREIGN PATENT DOCUMENTS

| JP | HEI 11-186593 | 7/1999 |
| WO | WO 02/061458 | 8/2002 |

* cited by examiner

*Primary Examiner*—Nikita Wells
*Assistant Examiner*—Anthony Quash
(74) *Attorney, Agent, or Firm*—Drinker Biddle & Reath LLP

(57) ABSTRACT

The present invention relates to an illuminant, etc., having a high response speed and a high luminous intensity. The illuminant comprises a substrate and a nitride semiconductor layer provided on one surface of the substrate. The nitride semiconductor layer emits fluorescence in response to incidence of electrons. At least part of the emitted fluorescence passes through the substrate, and then exits from the other surface of the substrate. Generation of the fluorescence is caused by incidence of electrons onto a quantum well structure of the nitride semiconductor layer and recombination of pairs of electrons and holes generated due to electron incidence, and the response speed of fluorescence generation is on the order of nanoseconds or less. Also, the luminous intensity of the fluorescence becomes equivalent to that of a conventional P47 fluorescent substance. Namely, the illuminant has a response speed and a luminous intensity that are sufficient for adaptation to scanning electron microscopes and mass spectroscopes.

8 Claims, 23 Drawing Sheets

Fig.1

| FLUORESCENT SUBSTANCE | RESPONSE SPEED | LUMINOUS INTENSITY |
|---|---|---|
| P47 | × | ○ |
| GaN ILLUMINANT | × | ○ |
| GaAsP ILLUMINANT | ○ | △ |

*Fig.17*

| | TOP LAYER | WELL WIDTH (nm) | BARRIER LAYER THICKNESS (nm) | In-COMPOSITION (x) | Si-DOPANT AMOUNT (cm$^{-3}$) |
|---|---|---|---|---|---|
| SAMPLE 1 | InGaN/GaN (QUANTUM WELL STRUCTURE) | 4 | 10 | 0.13 | $1.8 \times 10^{18}$ |
| SAMPLE 2 | InGaN/GaN (QUANTUM WELL STRUCTURE) | 2 | 10 | 0.13 | $1.8 \times 10^{18}$ |
| SAMPLE 3 | InGaN/GaN (QUANTUM WELL STRUCTURE) | 6 | 10 | 0.13 | $1.8 \times 10^{18}$ |
| SAMPLE 4 | InGaN/GaN (QUANTUM WELL STRUCTURE) | 4 | 10 | 0.07 | $1.8 \times 10^{18}$ |
| SAMPLE 5 | InGaN/GaN (QUANTUM WELL STRUCTURE) | 4 | 10 | 0.10 | $1.8 \times 10^{18}$ |
| SAMPLE 6 | InGaN/GaN (QUANTUM WELL STRUCTURE) | 4 | 10 | 0.14 | $1.8 \times 10^{18}$ |
| COMPARATIVE EXAMPLE 1 | GaN (BULK STRUCTURE) | — | — | — | 0 |
| COMPARATIVE EXAMPLE 2 | GaN (BULK STRUCTURE) | — | — | — | $1.4 \times 10^{17}$ |
| COMPARATIVE EXAMPLE 3 | GaN (BULK STRUCTURE) | — | — | — | $2.8 \times 10^{17}$ |
| COMPARATIVE EXAMPLE 4 | GaN (BULK STRUCTURE) | — | — | — | $1.4 \times 10^{18}$ |
| COMPARATIVE EXAMPLE 5 | GaN (BULK STRUCTURE) | — | — | — | $2.8 \times 10^{18}$ |
| COMPARATIVE EXAMPLE 6 | GaN (BULK STRUCTURE) | — | — | — | $6.8 \times 10^{18}$ |

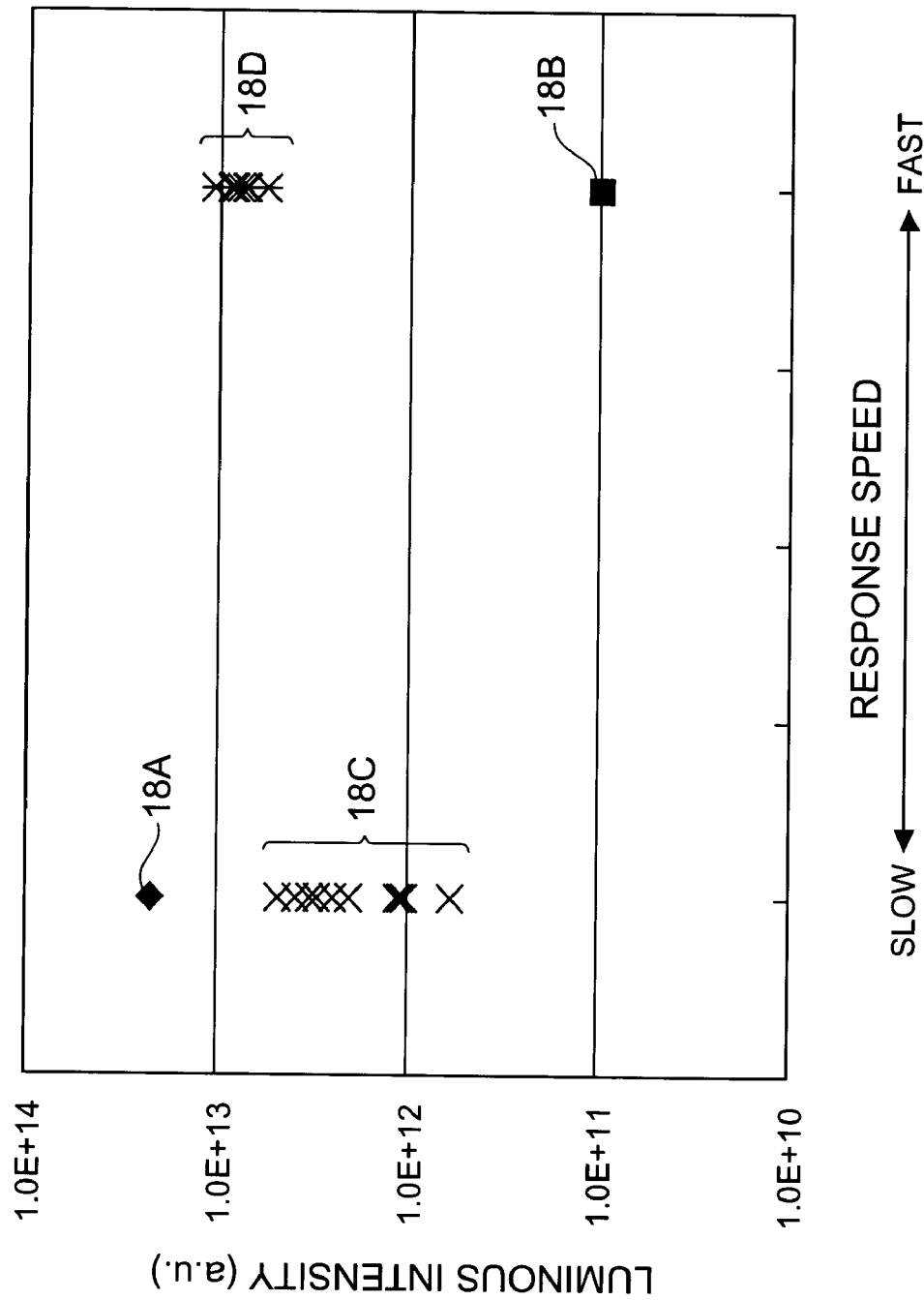

Fig.20

| SUBSTRATE MATERTIAL | TRANSMISSION WAVELENGTH (nm) | (eV) |
|---|---|---|
| GaN | 366 | 3.39 |
| AlN | 200 | 6.2 |
| LiAlO$_2$(LAO) | 191 | 6.5 |
| LiGaO$_2$(LGO) | 221 | 5.6 |
| ZnO | 368 | 3.37 |
| 6H-SiC | 409 | 3.03 |
| 4H-SiC | 380 | 3.26 |
| α-Al$_2$O$_3$(SAPPHIRE) | 170 | — |
| MgO | 200 | — |
| MgAl$_2$O$_4$ | 200 | — |

ILLUMINANT, AND, ELECTRON BEAM DETECTOR, SCANNING ELECTRON MICROSCOPE AND MASS SPECTROSCOPE EACH INCLUDING THE SAME

BACKGROUND OF THE INVENTION

1. Field of the Invention

The present invention relates to an illuminant, and, an electron beam detector, a scanning electron microscope and a mass spectroscope each including the same.

2. Related Background Art

Conventional electron beam detectors, at the time of measuring a high intensity electron beam, measure a current value caused by the electron beam to detect the electron beam. On the other hand, at the time of measuring an electron beam with a comparatively low intensity, the conventional electron beam detectors cannot successfully detect the electron beam because the electric charges caused by the electron beam is small. Thus, for example, an electron beam detector used for a scanning electron microscope (SEM) collects secondary electrons generated on a sample surface due to electron beam irradiation onto the sample surface, irradiates the collected secondary electrons onto a fluorescent substance, and measures fluorescence generated on the fluorescent substance by a photomultiplier (photodetector). As such a fluorescent substance, various fluorescent substances shown in FIG. 1 are known. Among these fluorescent substances, as one example, a luminous intensity (CL-intensity) due to electron beam irradiation of P47 is shown in FIG. 2. In the FIG. 2, the horizontal axis shows the wavelength (nm), the vertical axis shows the CL-intensity (in arbitrary units), and the peak wavelength of the CL-intensity of the P47 fluorescent substance is approximately 430 nm.

Recently, in the field of scanning electron microscopes and mass spectroscopes, a fluorescent substance having a high luminous intensity and a high response speed has been demanded. Because, for example, in scanning electron microscopes, a higher response speed of the fluorescent substance makes it possible to increase the scanning speed and improves performance of the device.

SUMMARY OF THE INVENTION

The inventors found the following problems as a result of consideration of the abovementioned prior arts.

Namely, in the conventional fluorescent substances shown in FIG. 1, it is difficult to obtain a sufficient high response speed (on the order of microseconds) for adaptation to scanning electron microscopes and mass spectroscopes. Furthermore, among the few fluorescent substances that can realize sufficient response speeds, a GaAsP illuminant is not suitable for scanning electron microscopes since its luminous intensity is low.

The invention was carried out in order to solve the above-mentioned problems, and an object thereof is to provide an illuminant with a high response speed and a high luminous intensity and to provide an electron beam detector, a scanning electron microscope, and a mass spectroscope, to which the illuminant is applied, respectively.

An illuminant according to the present invention is an emission source which converts incident electrons into fluorescence, and comprises at least a substrate and a nitride semiconductor layer. The substrate is comprised of a material that is transparent with respect to fluorescence. The nitride semiconductor layer is provided on one surface of the substrate, and preferably, has a quantum well structure that emits fluorescence in response to electron incidence. The quantum well structure is constructed by alternately laminating a plurality of barrier layers and a plurality of well layers.

In the illuminant, when the nitride semiconductor layer provided on one surface of the substrate emits fluorescence in response to electron incidence, at least part of the fluorescence passes through the substrate and then exits from the other surface of the substrate. The fluorescence is generated due to incidence of electrons onto the quantum well structure of the nitride semiconductor layer and recombination of pairs of electrons and holes generated due to electron incidence. The response speed is equal to or less than the order of microseconds. The luminous intensity of the fluorescence reaches an intensity at the same level as that of the conventional P47 fluorescent substance. Namely, the illuminant has a response speed and a luminous intensity that are sufficient for adaptation for scanning electron microscopes and mass spectroscopes.

The well width (thickness of the well layer) of the abovementioned quantum well structure is preferably 4 nm or less. In this case, an illuminant which emits fluorescence with a desired luminous intensity or higher can be obtained.

An electron beam detector according to the present invention comprises an illuminant having the above-mentioned structure and a photodetector. The photodetector has a sensitivity for fluorescence emitted from the illuminant.

In the electron beam detector, electron beam measurement is carried out by guiding fluorescence from the illuminant to the light entrance surface of the photodetector. Namely, electron beam measurement is carried out by means of fluorescence with a necessary and sufficient response speed and luminous intensity. Also, by applying the electron beam detector to a scanning electron microscope and a mass spectroscope, performance of these scopes can be improved.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 1 is a table showing characteristics of the conventional fluorescent substances;

FIG. 17 is a table that summarizes the specifications of the respective illuminants of Samples 1 through 6 and illuminants of Comparative Examples 1 through 6;

FIG. 18 is a graph comparing the luminous intensities of the illuminant having the quantum well structure of InGaN/GaN and the conventional illuminants;

FIG. 20 is a table which summarizes transmission wavelengths (nm) and energy band gaps (eV) of various substrate materials;

DESCRIPTION OF PREFERRED EMBODIMENTS

Hereinafter, respective embodiments of the illuminant, electron beam detector, scanning electron microscope, and mass spectroscope according to the present invention will be explained in detail with reference to FIGS. 3A–3B, 4, 5A–16B, and 17–23. In the description of the drawings, the same or equivalent elements are attached with the same symbol, and overlapping description is omitted.

Figure 2:
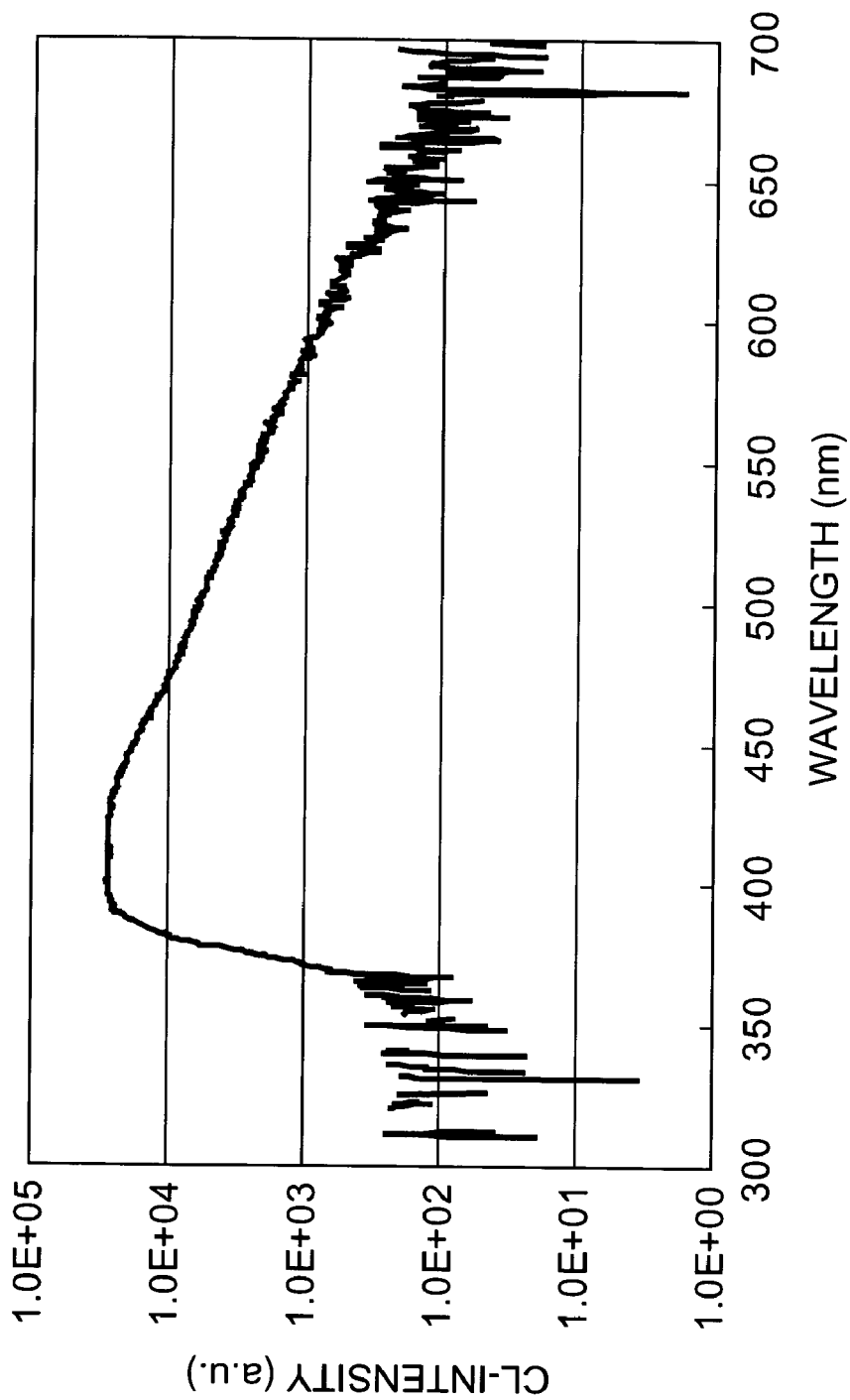
FIG. 2 is a graph showing luminous characteristics of the P47 fluorescent substance.
Figure 3A:
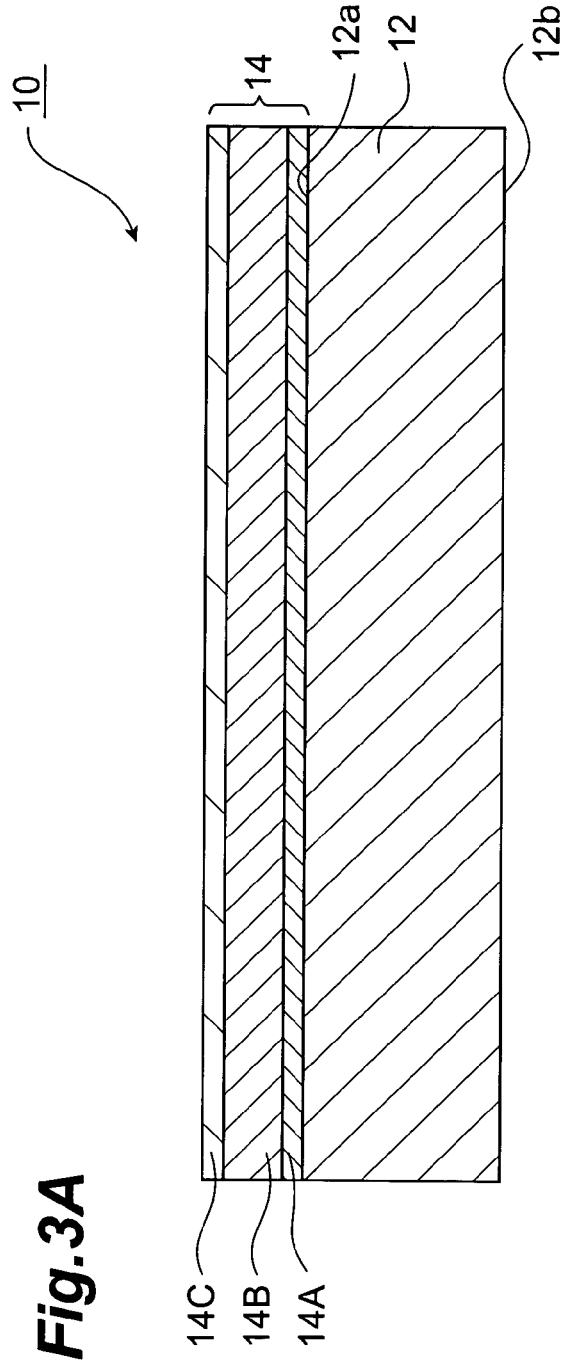
FIG. 3A and FIG. 3B are a sectional view showing the construction of an embodiment of the illuminant according to the present invention, and a sectional view showing the quantum well structure of the nitride semiconductor layer, respectively.
Figure 3B:
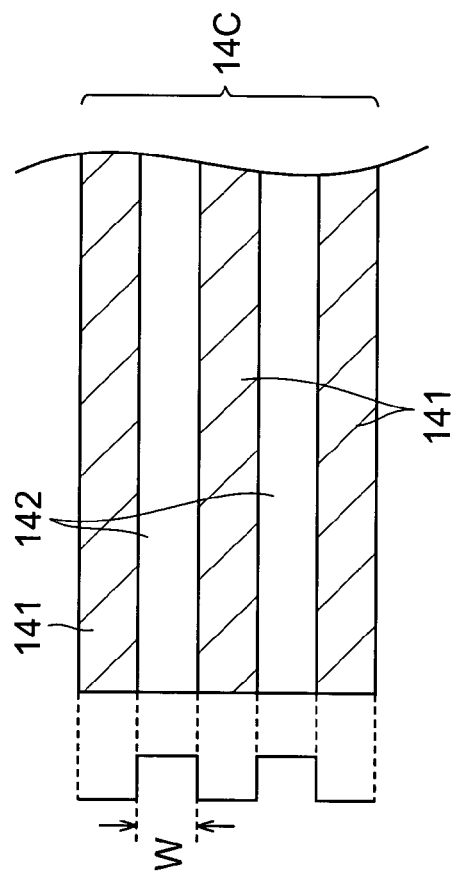

FIG. 3A is a sectional view showing the construction of an embodiment of the illuminant according to the present invention, and FIG. 3B is a sectional view showing the quantum well structure at the nitride semiconductor layer. As shown in FIG. 3A, the illuminant 10 comprises a substrate 12 and a nitride semiconductor layer 14 provided on a substrate surface 12a. The substrate 12 is made of sapphire through which light of a wavelength of 170 nm or more can pass. The nitride semiconductor layer 14 has a triple-layer structure in this embodiment, that is, in order from the substrate 12 side to the top layer side, an $In_xGa_{1-x}N$ ($0 \leq x \leq 1$) buffer layer 14A, a GaN layer 14B doped with Si, a quantum well structure layer 14C of InGaN/GaN are laminated. The quantum well structure layer 14C of InGaN/GaN, as shown in FIG. 3B, has a quantum well structure formed by alternately laminating InGaN barrier layers 141 and GaN well layers 142 with a thickness W (well width). The quantum well structure layer emits fluorescence with a wavelength of approximately 415 nm when an electron beam is irradiated. Namely, when an electron beam is made incident so as to reach the quantum well structure, pairs of electrons and holes are formed within the quantum well structure, and during the process of recombination of these within the quantum well structure, fluorescence is emitted.

Then, at least apart of the emitted fluorescence (having a wavelength longer than 170 nm) passes through the substrate 12 and then made to exit from the reversed surface 12b (substrate rear surface) of the substrate surface 12a. In this specification, "quantum well structure" includes quantum wire structures and quantum dot structures in addition to general quantum well structures as shown in FIG. 3B. Also, in this specification, "nitride semiconductor" means a compound that contains at least one of Ga, In, and Al as a Group III element and contains N as a principal Group V element.

Next, the quantum well structure layer 14C of the nitride semiconductor layer 14 will be explained.

Figure 4:
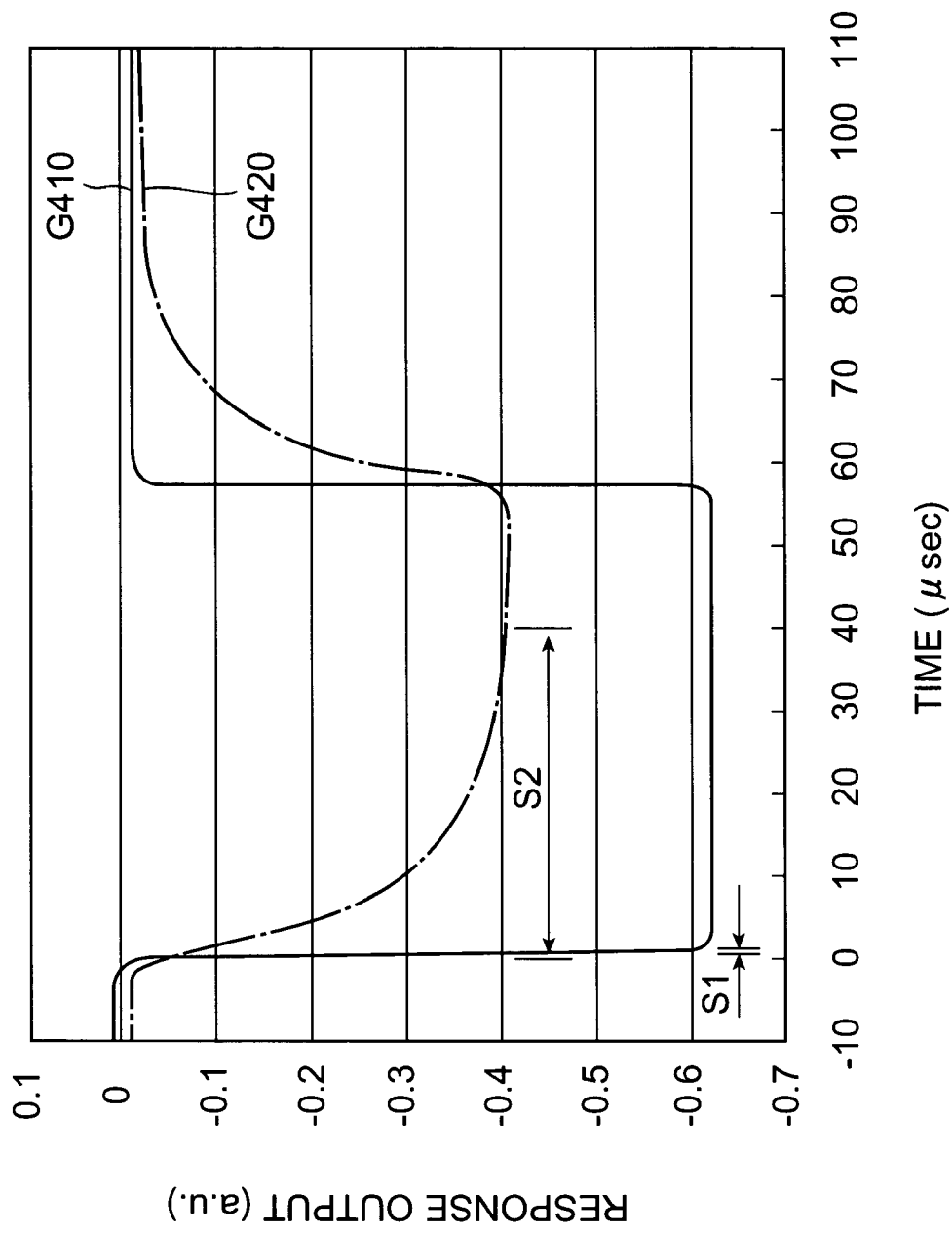
FIG. 4 is a graph showing response characteristics of an illuminant having a quantum well structure of InGaN/GaN.

First, the response characteristics of the quantum well structure layer 14C of InGaN/GaN will be explained. FIG. 4 is a graph showing the response characteristics of an illuminant having the quantum well structure of InGaN/GaN. In FIG. 4, the graph G410 shows the response characteristics of the illuminant having the quantum well structure of InGaN/GaN, and the graph G420 shows the response characteristics of a conventional GaN illuminant having a bulk structure as a comparative example. Furthermore, in FIG. 4, the horizontal axis shows time (μsec) and the vertical axis shows the response output (in arbitrary units) when a pulsed electron beam is made incident in the vicinity of time 0. As can be seen in FIG. 4, the response speed S1 (width of inclination of the graph G410) of the illuminant having the quantum well structure of InGaN/GaN is on the order of nanoseconds, and the response speed S2 (width of inclination of the graph G420) of the GaN illuminant having the bulk structure is on the order of ten-microseconds.

Next, the luminous characteristics of the quantum well structure layer 14C of InGaN/GaN will be explained. The inventors have measured the cathode luminescence (CL) intensity and the photoluminescence (PL) intensity in order to investigate the luminous characteristics of the quantum well structure of InGaN/GaN. Hereinafter, the measurement experiment will be explained.

SAMPLE 1

A method of manufacturing the illuminant 10 to be used for the measurement experiment will be explained. First, a sapphire substrate 12 is led into a growth chamber of a metal organic chemical vapor deposition (MOCVD) system, and in the hydrogen atmosphere, the sapphire substrate surface 12a is cleaned by being subjected to heat treatment at 1050° C. for 5 minutes. Then, after the substrate temperature is lowered to 475° C., an InGaN buffer layer 14A is deposited to be 25 nm on the substrate 12. Thereafter, the substrate temperature is increased to 1075° C. and a GaN layer 14B is made to grow to be 2.5 μm on the substrate 12. Subsequently, the substrate temperature is decreased to 800° C., whereby a quantum well structure layer 14C of $In_xGa_{1-x}N$ (x=0.13) is formed. The well width W of the quantum well structure layer 14C of $In_xGa_{1-x}N$ is 4 nm, the thickness of the barrier layer is 10 nm, and the number of wells is 11. The well layer 142 and the barrier layer 141 are doped with Si of $1.8 \times 10^{18}$ cm$^3$. Furthermore, the number of wells is not limited to 11, and may be properly adjusted according to the acceleration voltage of the incident electron beam. Here, the thickness of the barrier layer 141 is not limited to 10 nm, and may be any thickness as long as it can sufficiently confine electrons within the well layer 142.

In the Sample 1, trimethylgallium (Ga $(CH_3)_3$: TMGa) was used as the Ga source, trimethylindium (In $(CH_3)_3$: TMIn) was used as the In source, and monosilane ($SiH_4$) was used as the Si source, however, other organic metal materials (for example, triethylgallium (Ga $(C_2H_5)_3$: TEGa), triethylindium (In $(C_2H_5)_3$: TEIn), and other hydrides (for example, disilane ($Si_2H_4$), etc.) may be used.

Figure 5A:
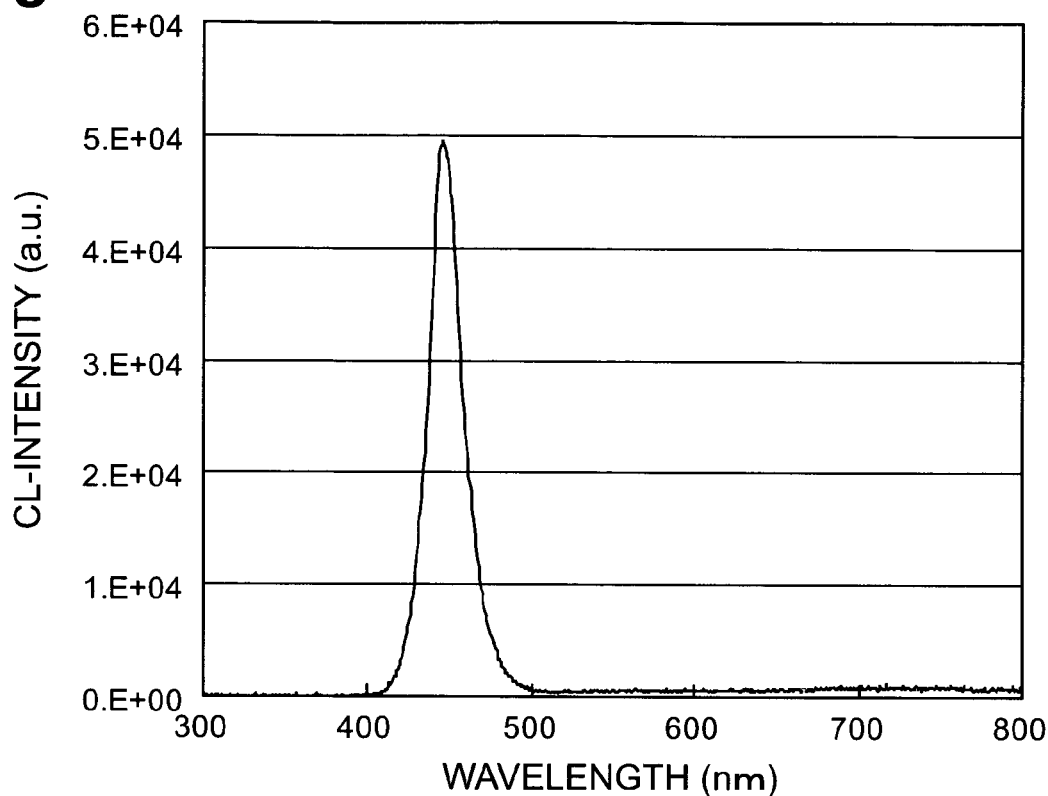
FIG. 5A and FIG. 5B are graphs showing luminous characteristics of an illuminant of Sample 1 as a detailed example of the illuminant according to the present invention.
Figure 5B:
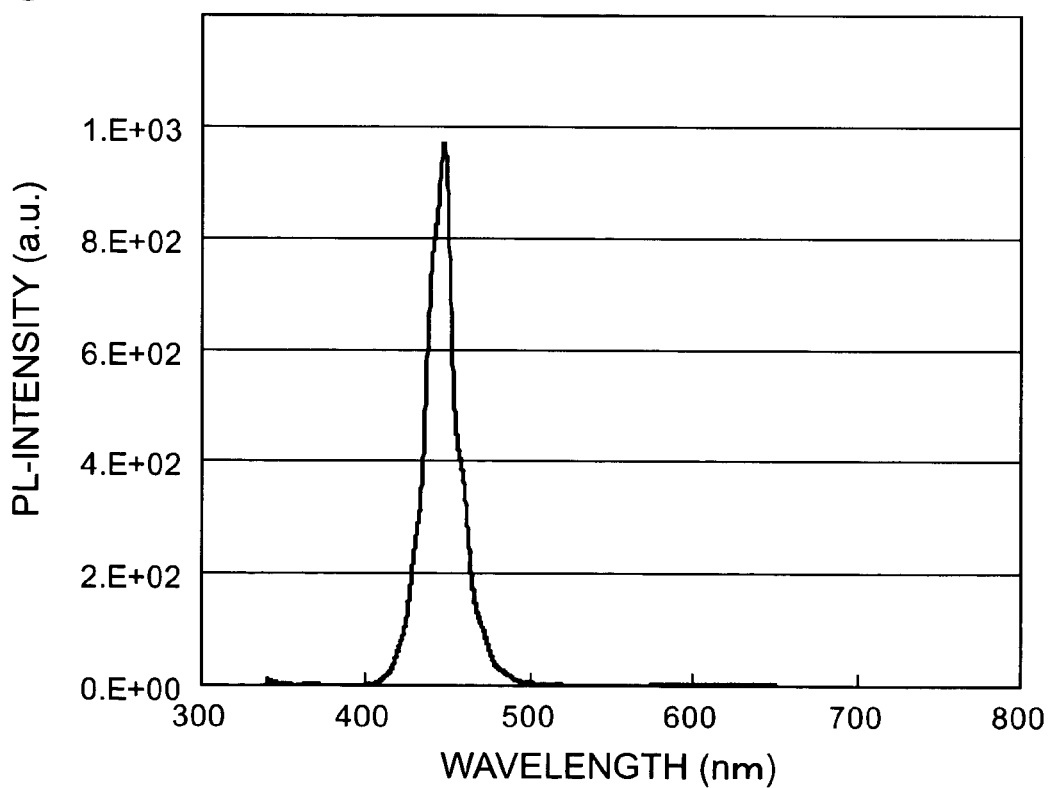

As a detailed example of the illuminant 10 manufactured as described above, the results of measurement of the cathode luminescence (CL) intensity and photoluminescence (PL) intensity of Sample 1 are shown in FIG. 5A and FIG. 5B. For the measurement of the PL-intensity, He—Cd light was used as pumping light.

Here, in manufacturing of the illuminant of Sample 1, a metal organic chemical vapor deposition system was used, however, a hydride vapor phase epitaxy (HVPE) system or a molecular beam epitaxy (MBE) system may be used. Each growth temperature depends on the system used for the test, so that the growth temperatures are not limited to the above-mentioned temperatures of Sample 1. Although InGaN was applied as the buffer layer 14A, the buffer layer 14A can be properly selected among nitride semiconductor materials that contain at least one or more of In, Al, and Ga as a Group III element and contain N as a principal Group V element.

The thickness of each layer and the Si-dopant amount are not limited to the above-mentioned amounts, however, the above-mentioned amounts are preferable. As the buffer layer 14A, the GaN layer 14B was laminated, however, other than the GaN layer, a Group III element can be selected among nitride semiconductors that contain at least one or more of In, Al, and Ga as a Group III element, contain N as a principal Group V element, and has an energy band gap that becomes transparent with respect to the emission wavelength of the quantum well structure 14C. Further, Si was doped in the GaN layer 14B and the quantum well structure 14C of InGaN/GaN, however, it is not limited to Si, and a different impurity (for example, Mg) may be doped, or no impurity may be doped as appropriate.

SAMPLE 2

Figure 6A:
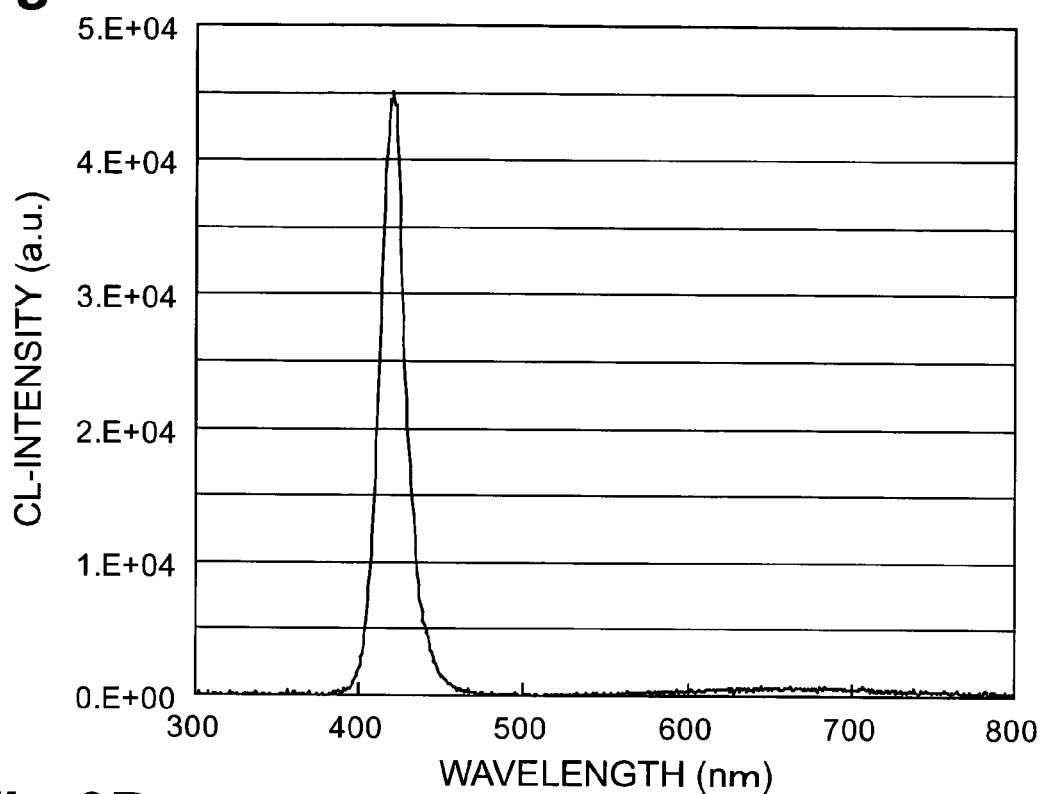
FIG. 6A and FIG. 6B are graphs showing luminous characteristics of an illuminant of Sample 2 as a detailed example of the illuminant according to the present invention.
Figure 6B:
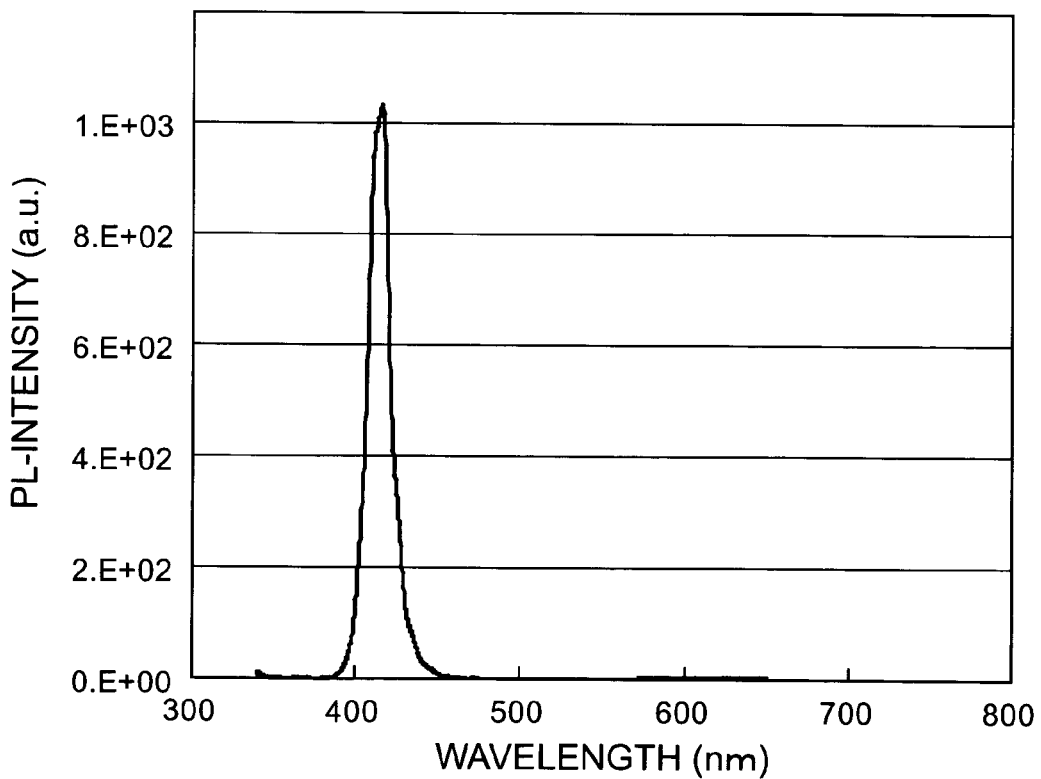

FIG. 6A and FIG. 6B are graphs showing the luminous characteristics of an illuminant of Sample 2 as a detailed example of the illuminant according to the present invention. In detail, FIG. 6A shows the CL-intensity of Sample 2, and FIG. 6B shows the PL-intensity of Sample 2.

The Sample 2 is an illuminant which is obtained by changing the well width of the quantum well structure layer of InGaN/GaN in the Sample 1 to 2 nm. Other points in the construction are the same as those of the illuminant of Sample 1.

SAMPLE 3

Figure 7A:
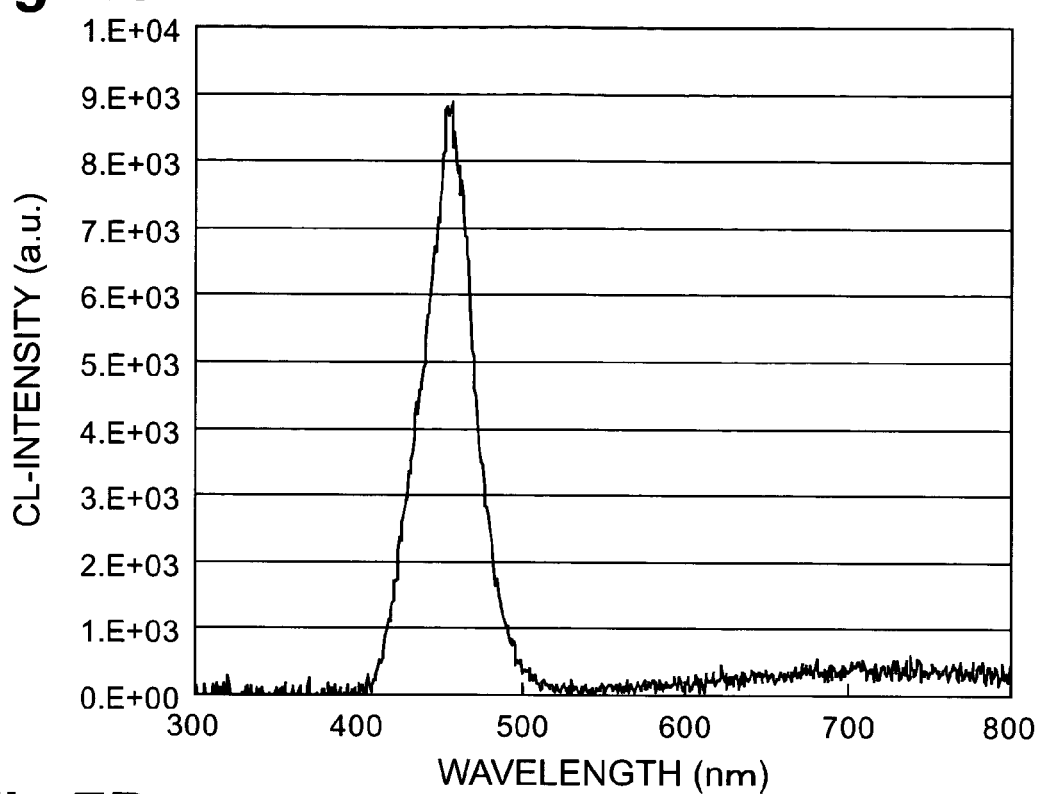
FIG. 7A and FIG. 7B are graphs showing luminous characteristics of an illuminant of Sample 3 as a detailed example of the illuminant according to the present invention.
Figure 7B:
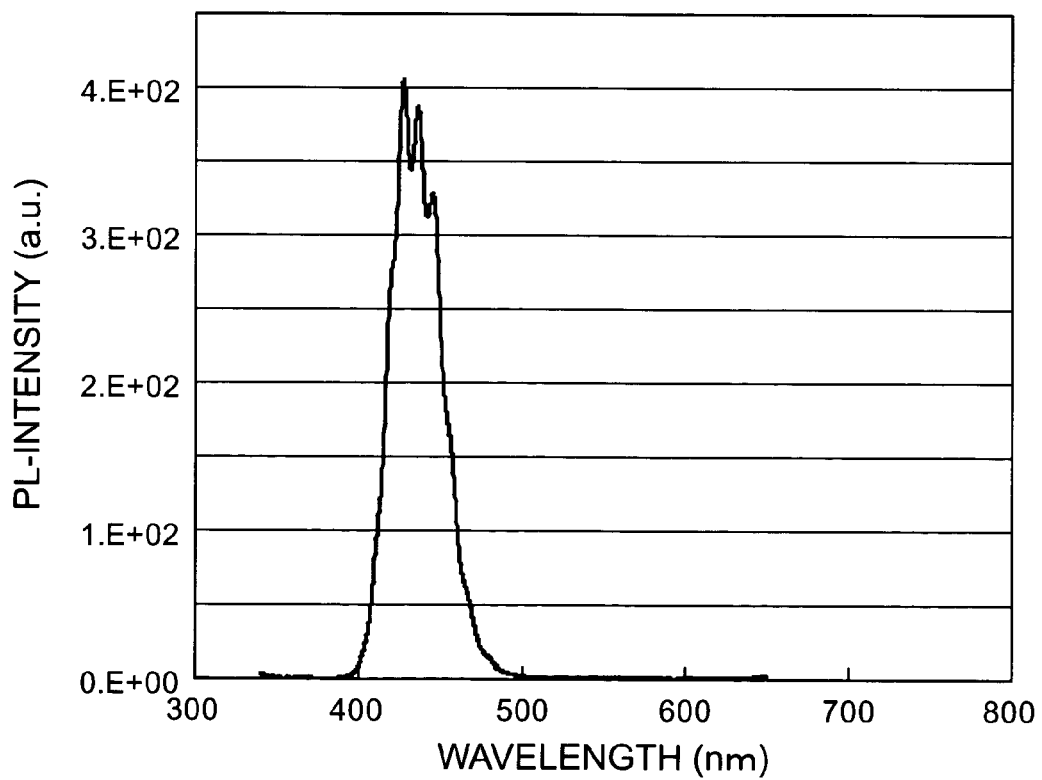

FIG. 7A and FIG. 7B are graphs showing the luminous characteristics of an illuminant of Sample 3 as a detailed example of the illuminant according to the present invention. In detail, FIG. 7A shows the CL-intensity of Sample 3, and FIG. 7B shows the PL-intensity of Sample 3.

The Sample 3 is an illuminant obtained by changing the well width of the quantum well structure of InGaN/GaN of the Sample 1 to 6 nm. Other points in the construction are the same as those of the illuminant of Sample 1.

SAMPLE 4

Figure 8A:
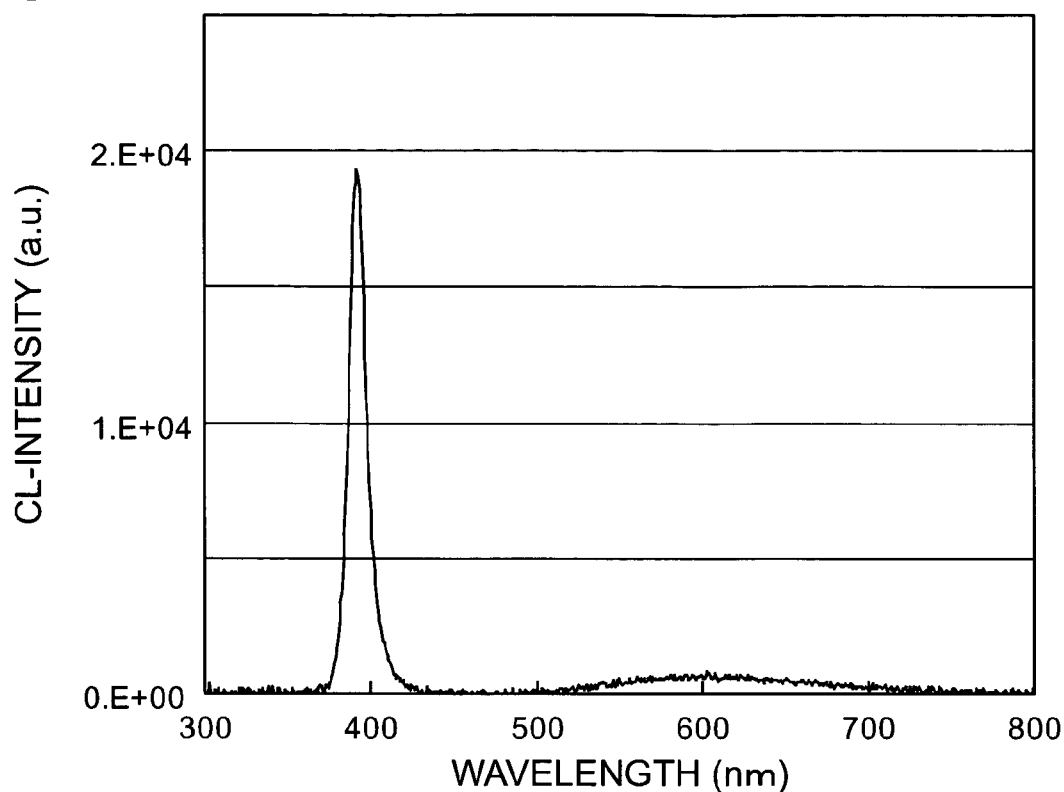
FIG. 8A and FIG. 8B are graphs showing luminous characteristics of an illuminant of Sample 4 as a detailed example of the illuminant according to the present invention.
Figure 8B:
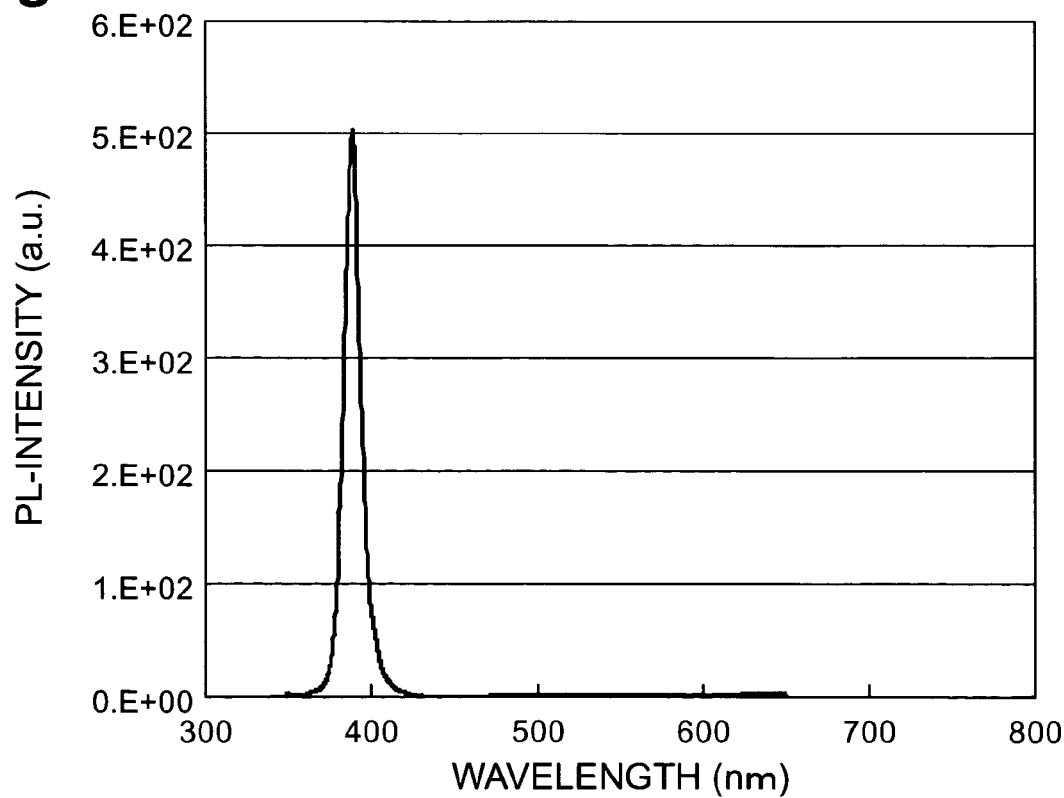

FIG. 8A and FIG. 8B are graphs showing the luminous characteristics of an illuminant of Sample 4 as a detailed example of the illuminant according to the present invention. In detail, FIG. 8A shows the CL-intensity of Sample 4, and FIG. 8B shows the PL-intensity of Sample 4.

The Sample 4 is an illuminant obtained by changing the In-composition (x) in the Sample 1 to 0.07. Other points in the construction are the same as those of the illuminant of Sample 1.

SAMPLE 5

Figure 9A:
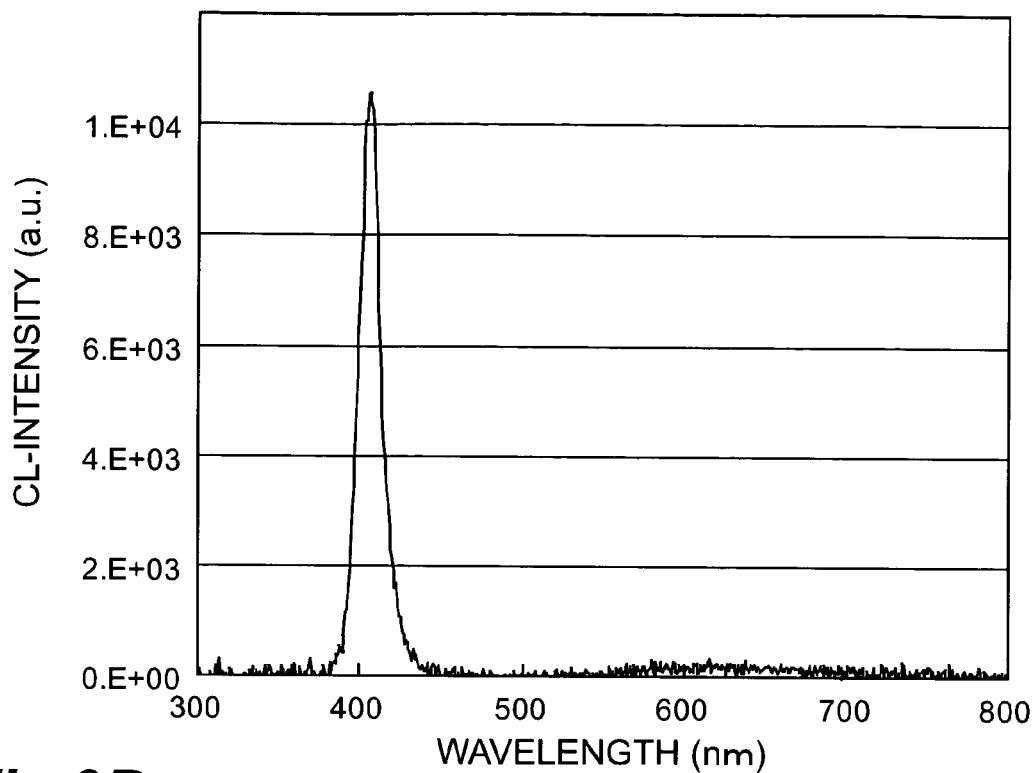
FIG. 9A and FIG. 9B are graphs showing luminous characteristics of an illuminant of Sample 5 as a detailed example of the illuminant according to the present invention.
Figure 9B:
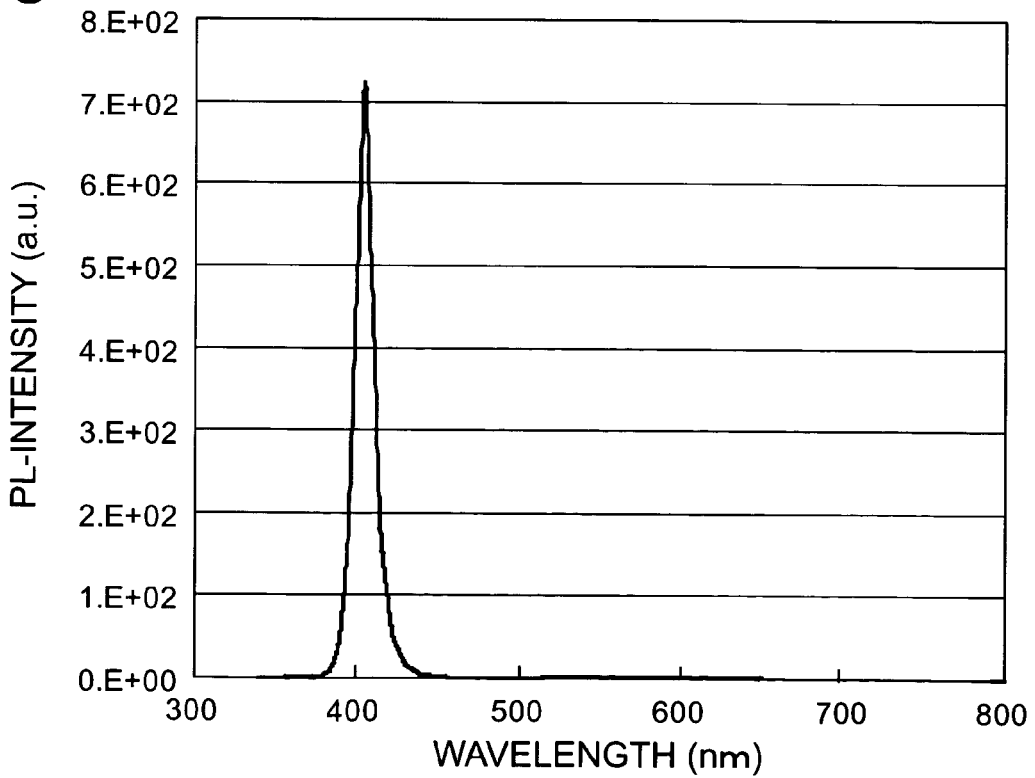

FIG. 9A and FIG. 9B are graphs showing the luminous characteristics of an illuminant of Sample 5 as a detailed example of the illuminant according to the present invention. In detail, FIG. 9A shows the CL-intensity of Sample 5 and FIG. 9B shows the PL-intensity of Sample 5.

The Sample 5 is an illuminant obtained by changing the In-composition (x) in the Sample 1 to 0.10. Other points in the construction are the same as those of the illuminant of Sample 1.

SAMPLE 6

Figure 10A:
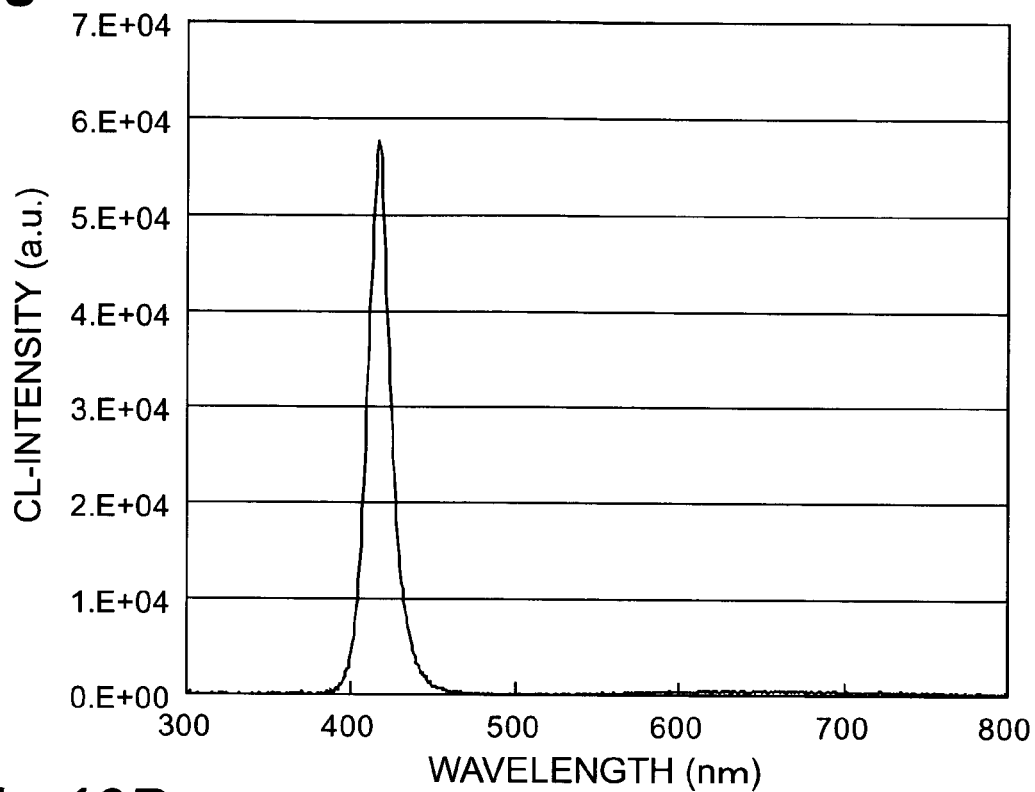
FIG. 10A and FIG. 10B are graphs showing luminous characteristics of an illuminant of Sample 6 as a detailed example of the illuminant according to the present invention.
Figure 10B:
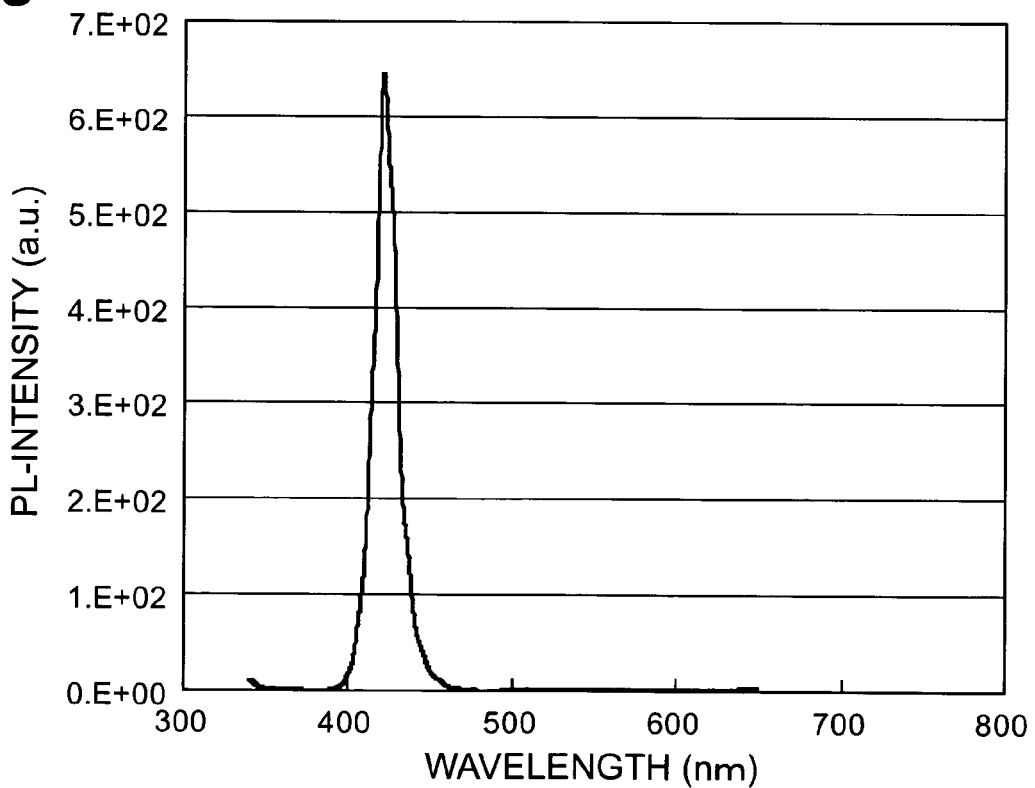

FIG. 10A and FIG. 10B are graphs showing the luminous characteristics of an illuminant of Sample 6 as a detailed example of the illuminant according to the present invention. In detail, FIG. 10A shows the CL-intensity of Sample 6, and FIG. 10B shows the PL-intensity of Sample 6.

The Sample 6 is an illuminant obtained by changing the In-composition (x) in the Sample 1 to 0.14. Other points in the construction are the same as those of the illuminant of Sample 1.

Next, comparative examples for comparison with the Samples 1 through 6 will be explained.

COMPARATIVE EXAMPLE 1

Figure 11A:
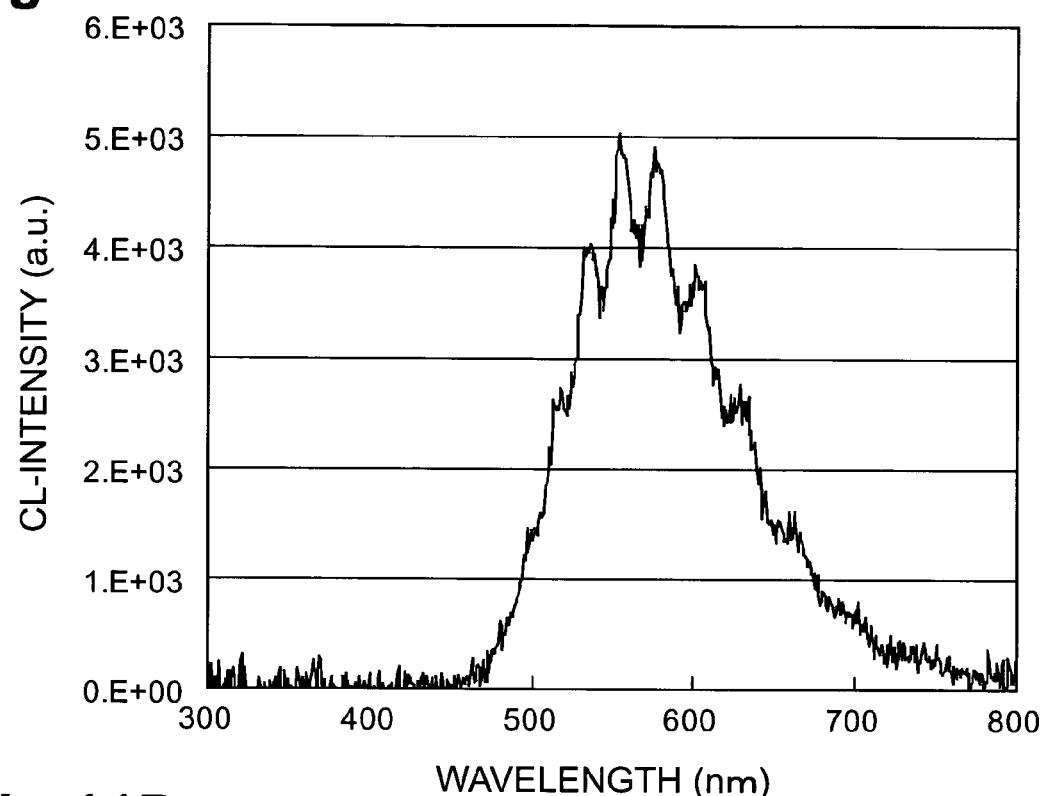
FIG. 11A and FIG. 11B are graphs showing luminous characteristics of an illuminant of Comparative Example 1.
Figure 11B:
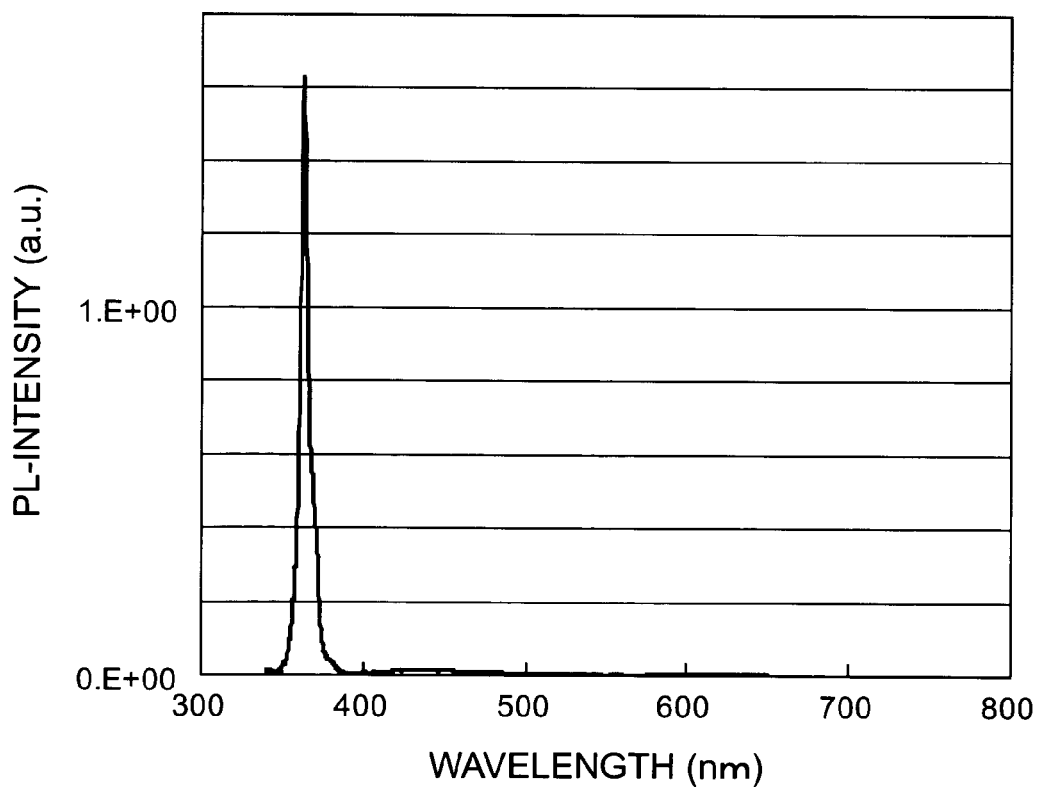

FIG. 11A and FIG. 11B are graphs showing the luminous characteristics of an illuminant of Comparative Example 1. In detail, FIG. 11A shows the CL-intensity of Comparative Example 1, and FIG. 11B shows the PL-intensity of Comparative Example 1.

The Comparative Example 1 is an illuminant in which the quantum well structure layer 14C in the Sample 1 is not provided, and Si is not doped into the GaN layer 14B.

COMPARATIVE EXAMPLE 2

Figure 12A:
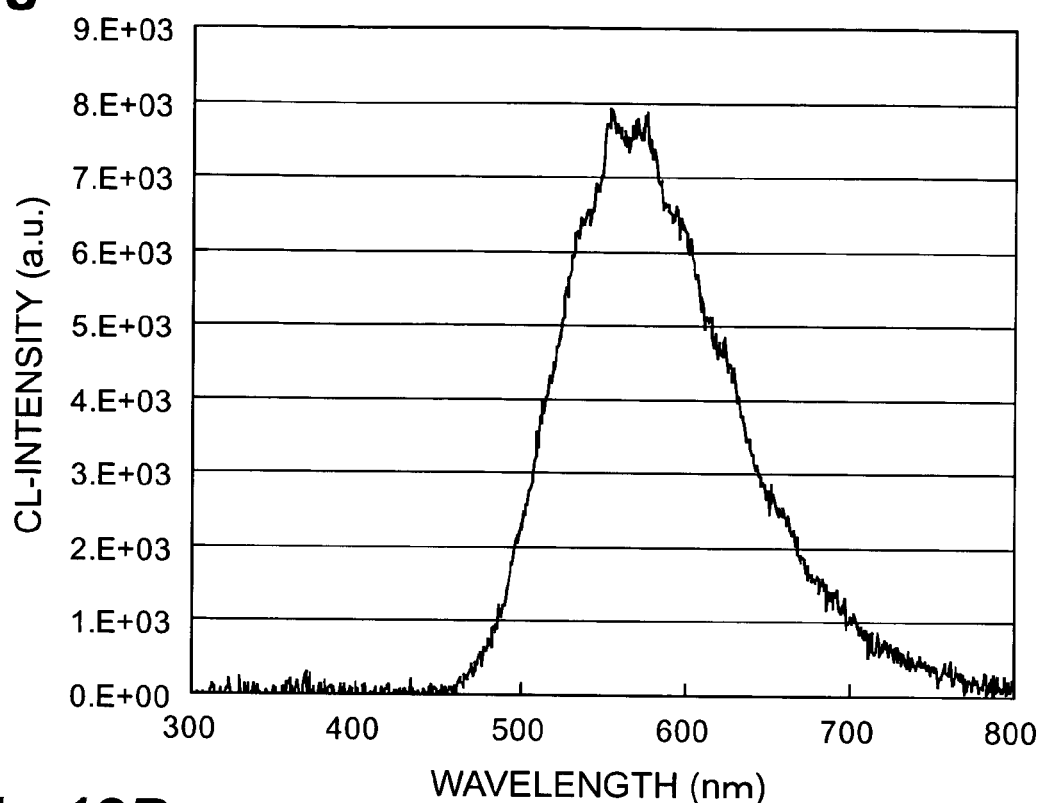
FIG. 12A and FIG. 12B are graphs showing luminous characteristics of an illuminant of Comparative Example 2.
Figure 12B:
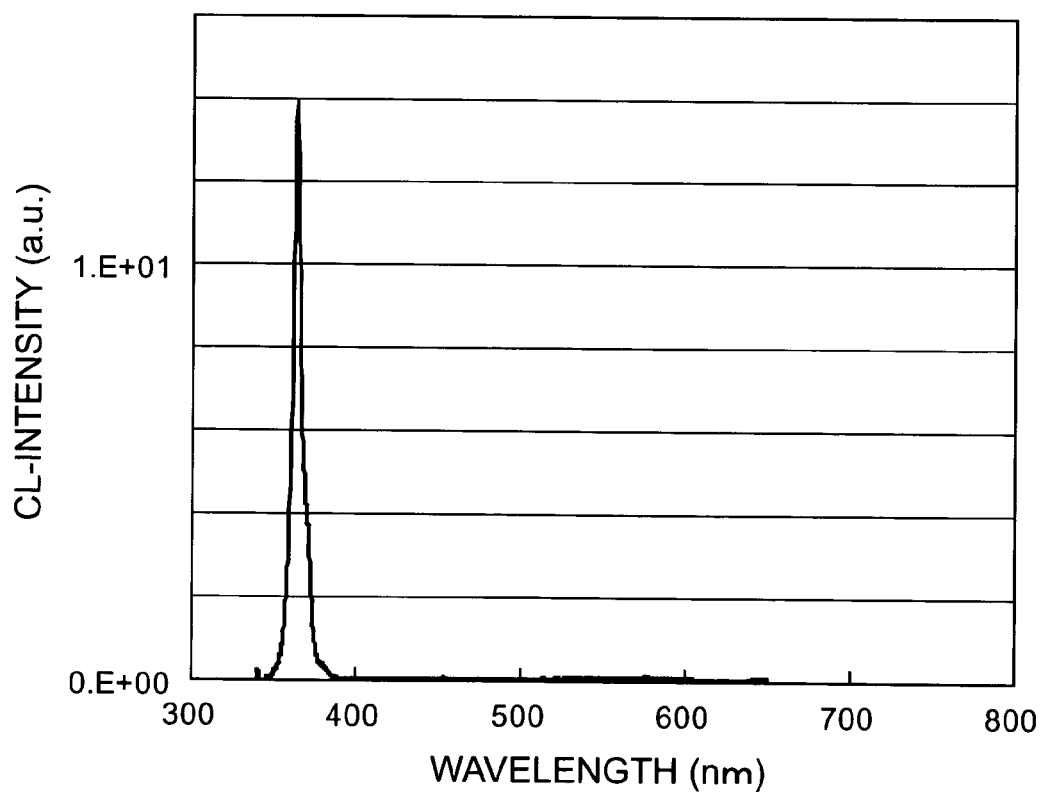

FIG. 12A and FIG. 12B are graphs showing the luminous characteristics of an illuminant of Comparative Example 2. In detail, FIG. 12A shows the CL-intensity of Comparative Example 2, and FIG. 12B shows the PL-intensity of Comparative Example 2.

Comparative Example 2 is an illuminant in which the quantum well structure layer 14C in the Sample 1 is not provided, and Si of $1.4 \times 10^{17}$ cm$^{-3}$ has been doped into the GaN layer 14B.

COMPARATIVE EXAMPLE 3

Figure 13A:
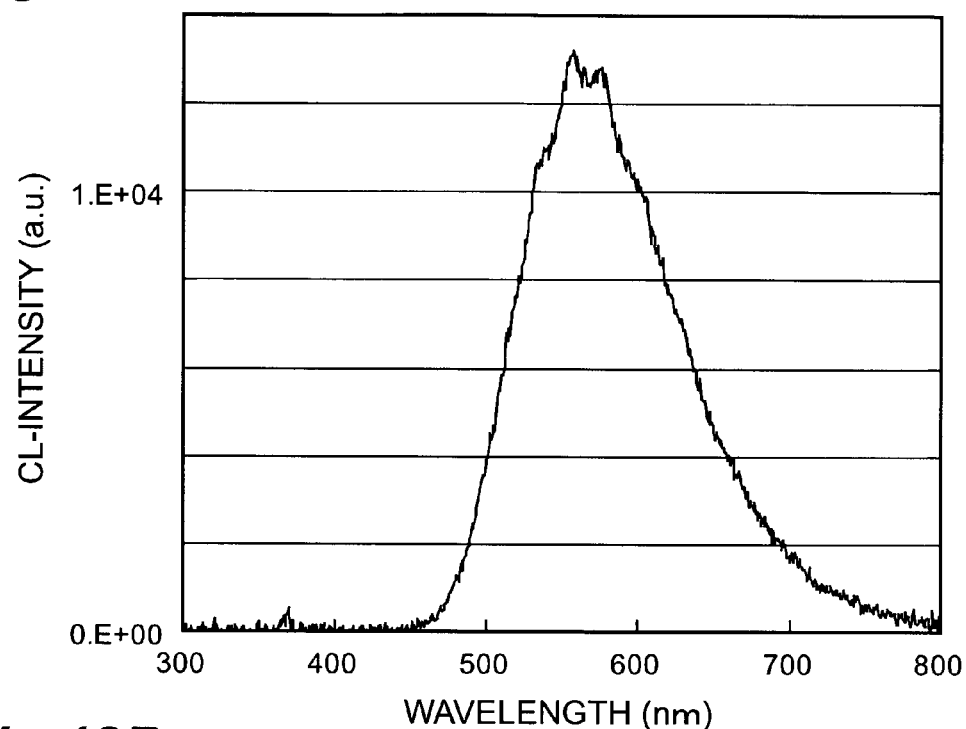
FIG. 13A and FIG. 13B are graphs showing luminous characteristics of an illuminant of Comparative Example 3.
Figure 13B:
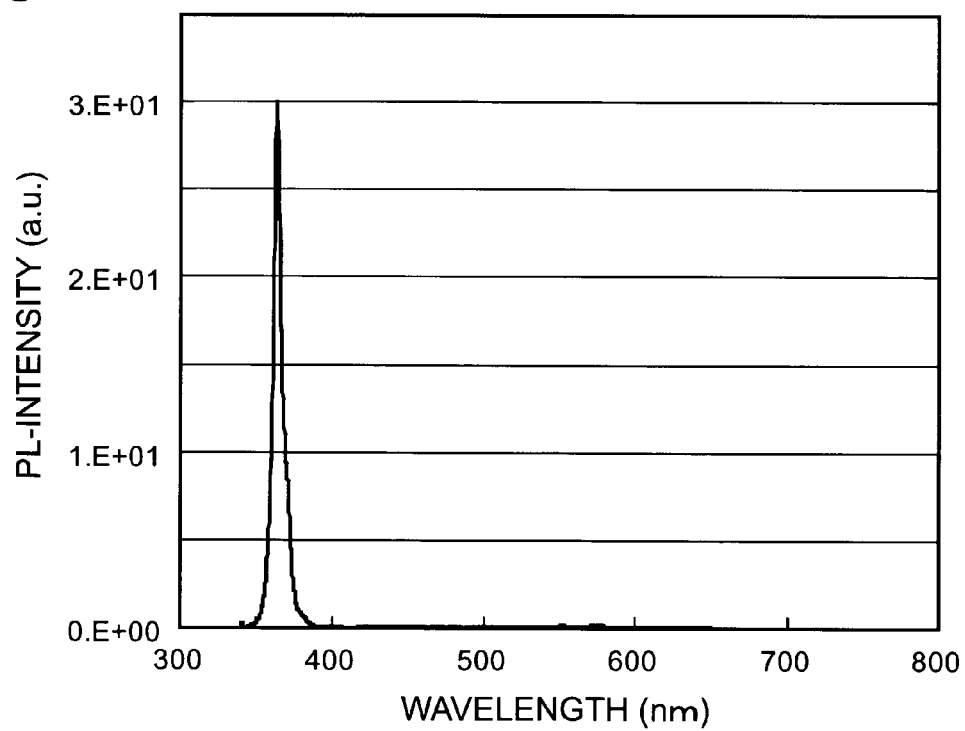

FIG. 13A and FIG. 13B are graphs showing the luminous characteristics of an illuminant of Comparative Example 3. In detail, FIG. 13A shows the CL-intensity of Comparative Example 3, and FIG. 13b shows the PL-intensity of Comparative Example 3.

The Comparative Example 3 is an illuminant obtained by changing the Si-dopant amount in the Comparative Example 2 to $2.8 \times 10^{17}$ cm$^{-3}$.

COMPARATIVE EXAMPLE 4

Figure 14A:
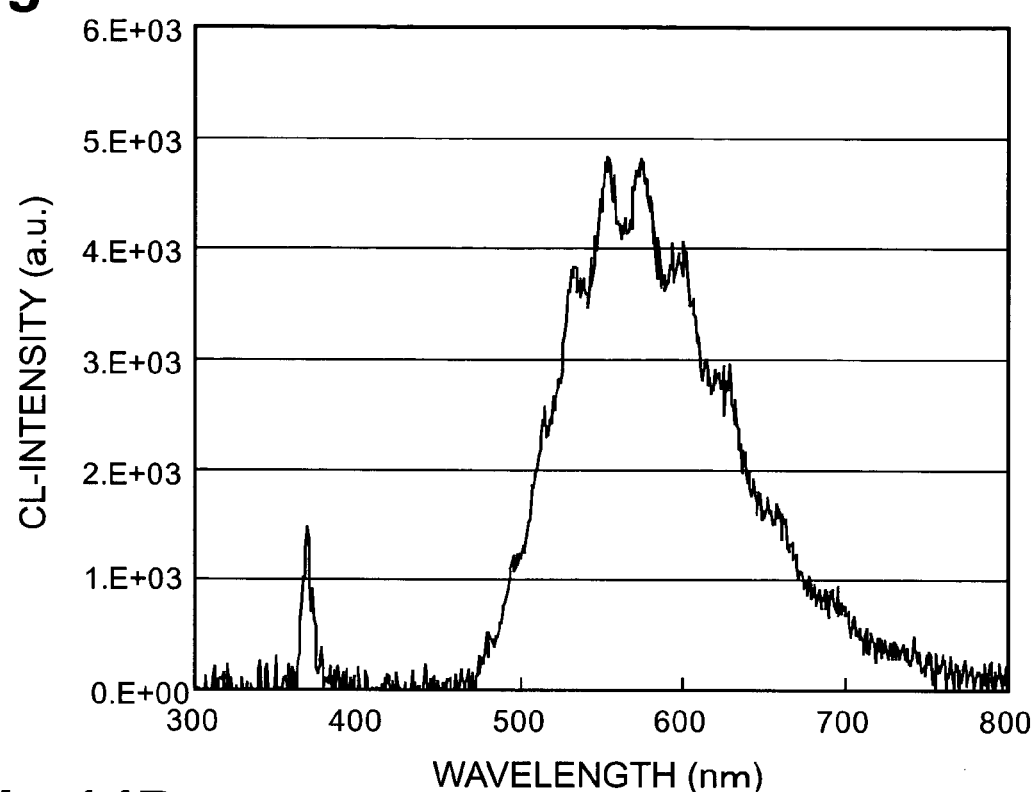
FIG. 14A and FIG. 14B are graphs showing luminous characteristics of an illuminant of Comparative Example 4.
Figure 14B:
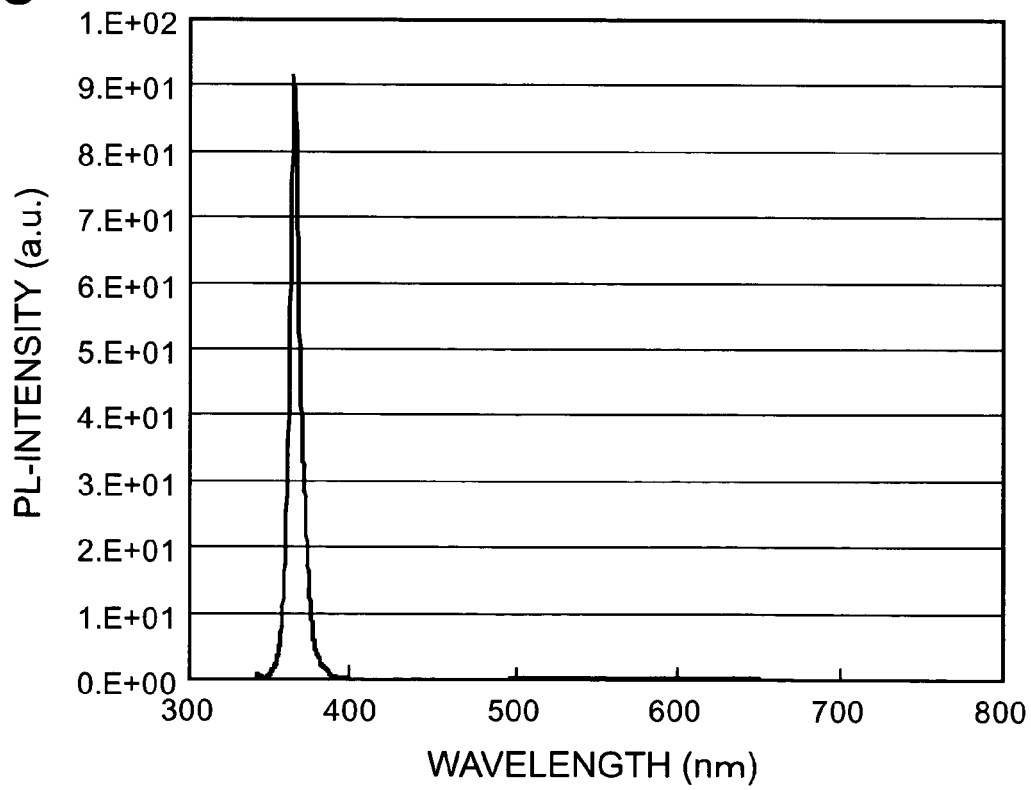

FIG. 14A and FIG. 14B are graphs showing the luminous characteristics of an illuminant of Comparative Example 4. In detail, FIG. 14A shows the CL-intensity of Comparative Example 4, and FIG. 14B shows the PL-intensity of Comparative Example 4.

The Comparative Example 4 is an illuminant obtained by changing the Si-dopant amount in the Comparative Example 2 to $1.4 \times 10^{18}$ cm$^{-3}$.

COMPARATIVE EXAMPLE 5

Figure 15A:
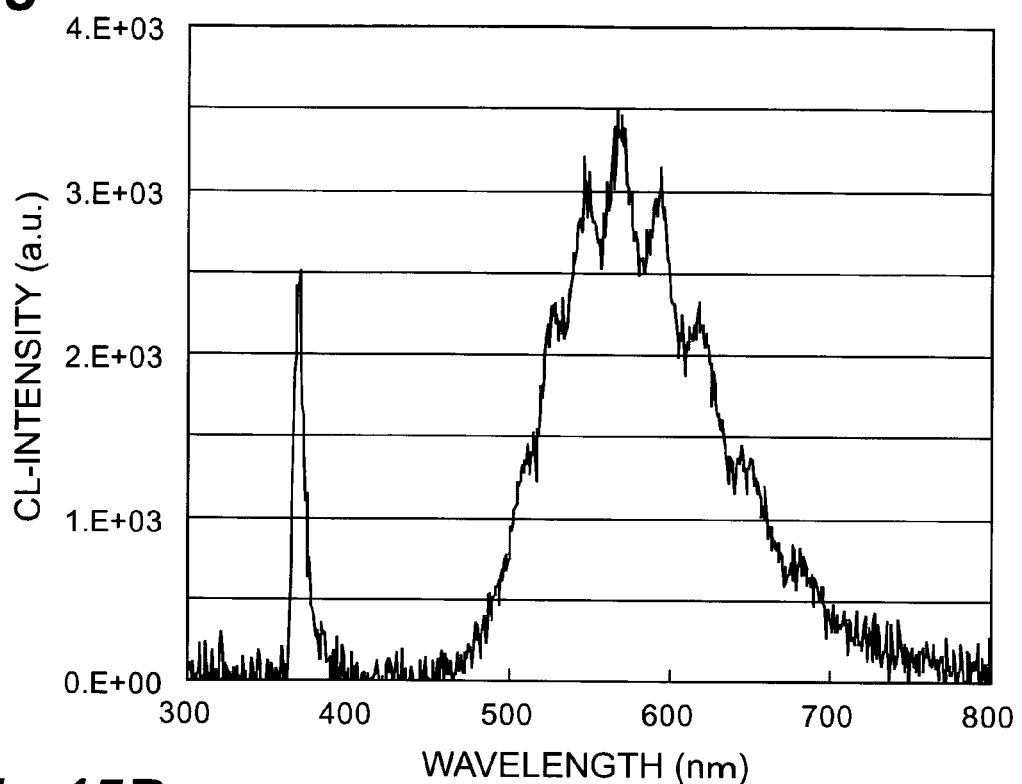
FIG. 15A and FIG. 15B are graphs showing luminous characteristics of an illuminant of Comparative Example 5.
Figure 15B:
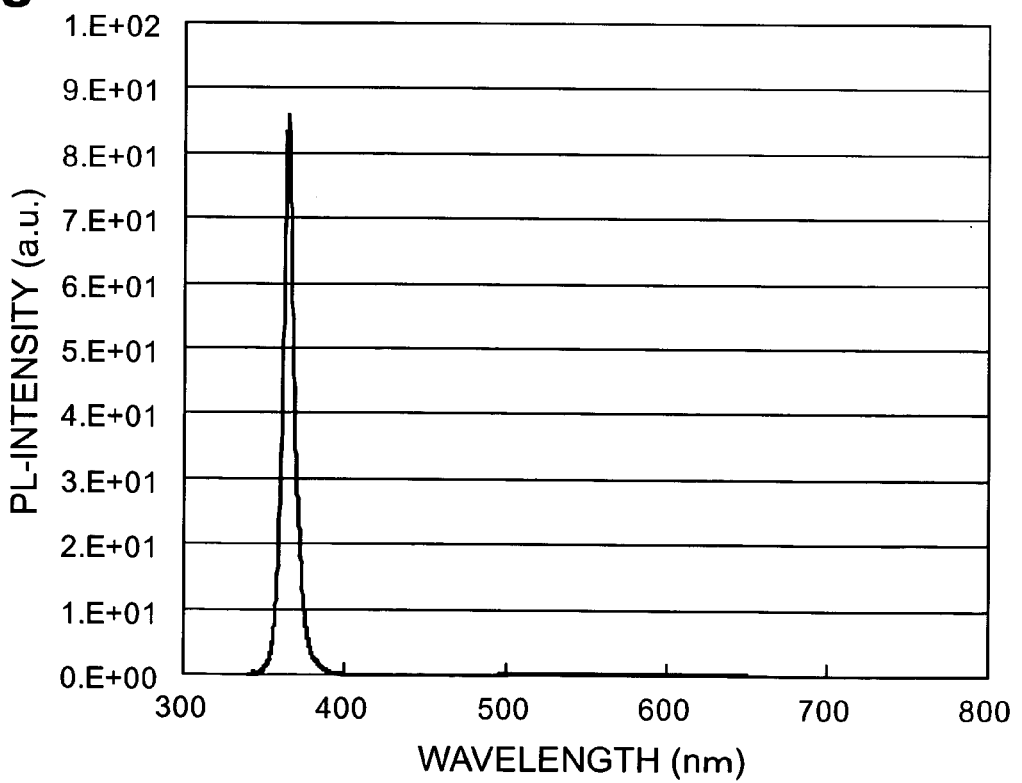

FIG. 15A and FIG. 15B are graphs showing the luminous characteristics of an illuminant of Comparative Example 5. In detail, FIG. 15A shows the CL-intensity of Comparative Example 5, and FIG. 15B shows the PL-intensity of Comparative Example 5.

The Comparative Example 5 is an illuminant obtained by changing the Si-dopant amount in the Comparative Example 2 to $2.8 \times 10^{18}$ cm$^{-3}$.

COMPARATIVE EXAMPLE 6

Figure 16A:
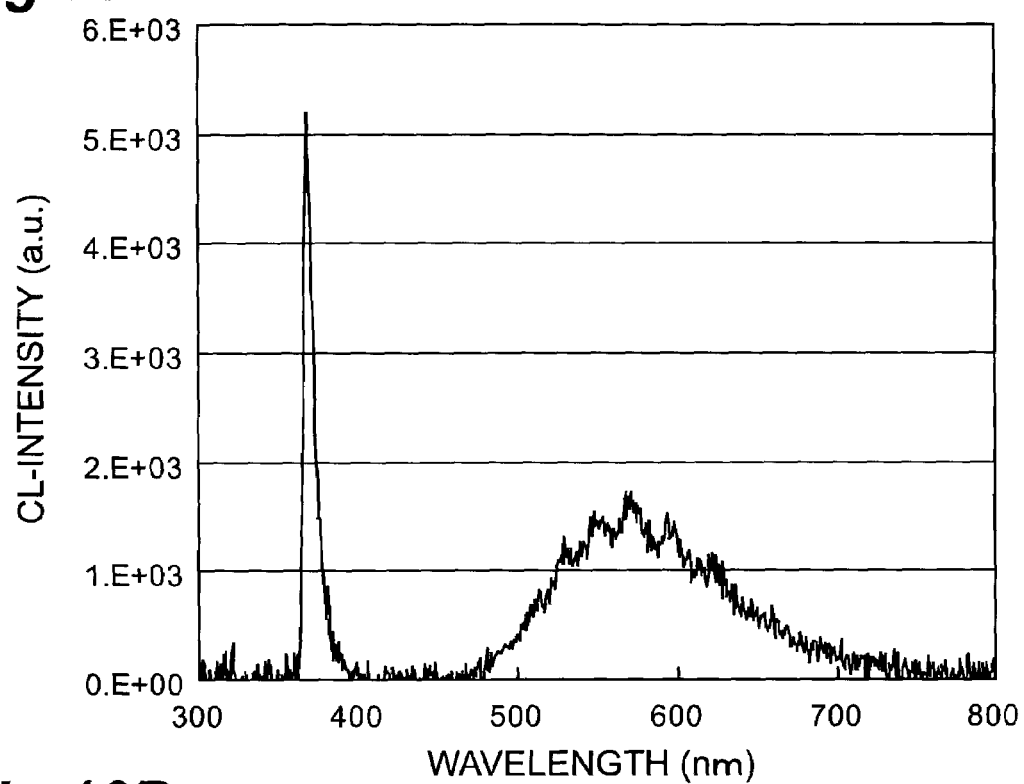
FIG. 16A and FIG. 16B are graphs showing luminous characteristics of an illuminant of Comparative Example 6.
Figure 16B:
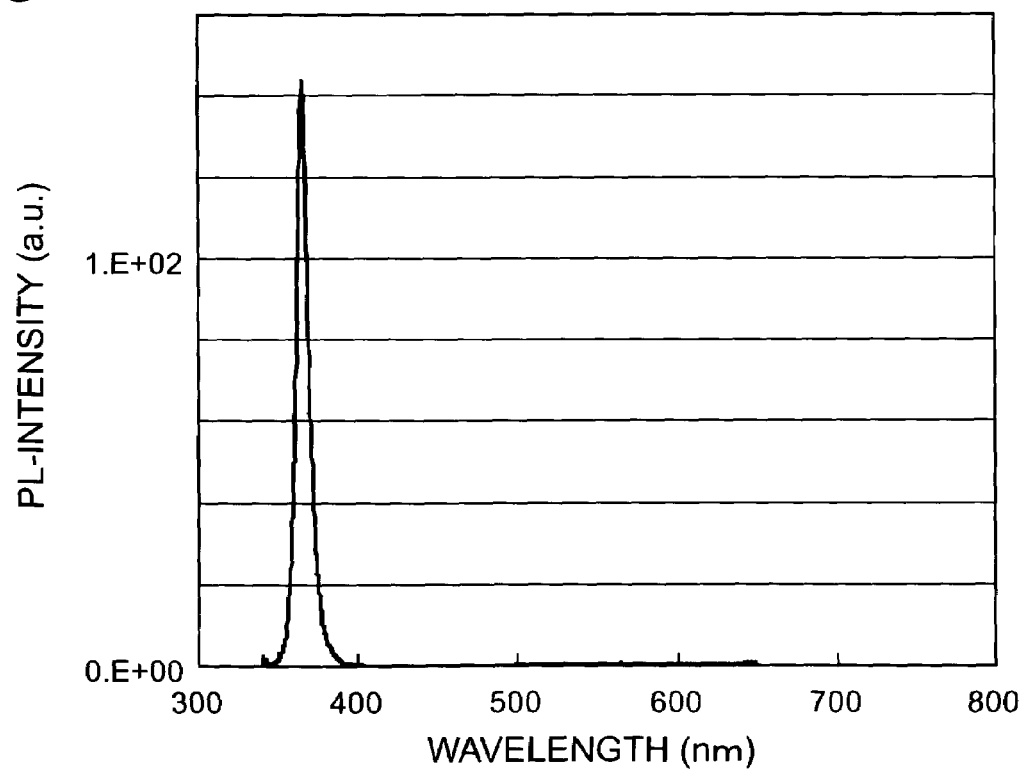

FIG. 16A and FIG. 16B are graphs showing the luminous characteristics of an illuminant of Comparative Example 6. In detail, FIG. 16A shows the CL-intensity of Comparative Example 6, and FIG. 16B shows the PL-intensity of Comparative Example 6.

The Comparative Example 6 is an illuminant obtained by changing the Si-dopant amount in the Comparative Example 2 to $6.8 \times 10^{18}$ cm$^{-3}$.

Here, in all graphs shown in FIGS. 5A through 16A, the horizontal axis shows the luminous wavelength (nm), and the vertical axis shows the CL-intensity (in arbitrary units). In all graphs shown in FIGS. 5B through 16B, the horizontal axis shows the luminous wavelength (nm), and the vertical axis shows the PL-intensity (in arbitrary units). Furthermore, FIG. 17 is a table which summarizes the specifications of the illuminants of the Samples 1 through 6 and the illuminants of the Comparative Examples 1 through 6.

From the above measurement results, it can be understood that, in the illuminants (Sample 1 through 6) having the quantum well structure of InGaN/GaN, band-to-band emission is dominant in regard to the CL-intensity (see FIGS. 5A through 10A). It can be also understood that, in the conventional GaN illuminants (Comparative Examples 1 through 6), although band-to-band emission increases as the Si-dopant amount increases, deep-level emission (emission through the level within the band gap) is dominant even after Si of $6.8 \times 10^{18}$ cm$^{-3}$ is doped (see FIGS. 11A through 16A).

Namely, the reason for an increase in response speed of the illuminant having the InGaN/GaN quantum well structure as described above is that band-to-band emission is dominant, and it is considered that the response speed of the conventional GaN illuminant having a bulk structure is low since deep-level emission is dominant.

Furthermore, the inventors have measured the luminous intensity of fluorescence emitted from the illuminant having the quantum well structure of InGaN/GaN, and have compared it with the luminous intensities (in arbitrary units) of the conventional illuminants (see FIG. 18). In FIG. 18, the symbol "♦" shows the luminous intensity of a P47 illuminant, the symbol "■" shows the luminous intensity of a GaAsP illuminant, the symbol "x" shows the luminous intensity of a GaN illuminant, and the symbol "*" shows the luminous intensity of an illuminant having an InGaN quantum well structure. From FIG. 18, it can be understood that the luminous intensity of the illuminant having the InGaN/GaN quantum well structure (average: approximately $7.20 \times 10^{12}$) is considerably higher than the luminous intensity of the GaN illuminant having a bulk structure (average: approximately $4.81 \times 10^{12}$), and is at the same level as the luminous intensity of the P47 illuminant having a high luminous intensity. Also, it can be understood that the illuminant having the quantum well structure of InGaN/GaN has a luminous intensity that is 100 times the luminous intensity ($9.8 \times 10^{10}$) of the GaAsP illuminant that obtains sufficient response characteristics.

Additionally, from the measurement results (FIGS. 5B through 16B), it can be understood that, in regard to the PL-intensity, band-to-band emission is dominant in both the illuminants (Sample 1 through 6) having the quantum well structure of InGaN/GaN and the conventional GaN illuminants (Comparative Examples 1 through 6) having a bulk structure. Thus, in the conventional GaN illuminants having a bulk structure, deep-level emission becomes dominant in CL, and band-to-band emission becomes dominant in PL. The reason for these is considered to be that the pumping density of PL (carrier density generated per unit area) is 4 or 5 digits larger than the pumping density of CL, whereby deep-level carriers become saturated in PL and band-to-band emission becomes dominant.

Dependency of the luminous intensity of the illuminant having the quantum well structure on the Si-dopant amount could not be confirmed.

As described above, as a result of diligent study, the inventors have found that an illuminant having the quantum well structure of InGaN/GaN realized a response speed that was higher than that of conventional GaN substrates having a bulk structure. They have also found that the luminous intensity of the illuminant having the quantum well structure of InGaN/GaN was higher than or equivalent to the luminous intensities of conventional GaN illuminants or P47 illuminants having a bulk structure. Both the response speed and luminous intensity of the illuminant having the quantum well structure of InGaN/GaN are sufficient for use in scanning electron microscopes or mass spectroscopes. Namely, the illuminant 10 including the nitride semiconductor layer 14 having the quantum well structure layer 14C of InGaN/GaN is more suitable than the conventional fluorescent substances as an illuminant to be applied to scanning electron microscopes and mass spectroscopes.

Figure 19:
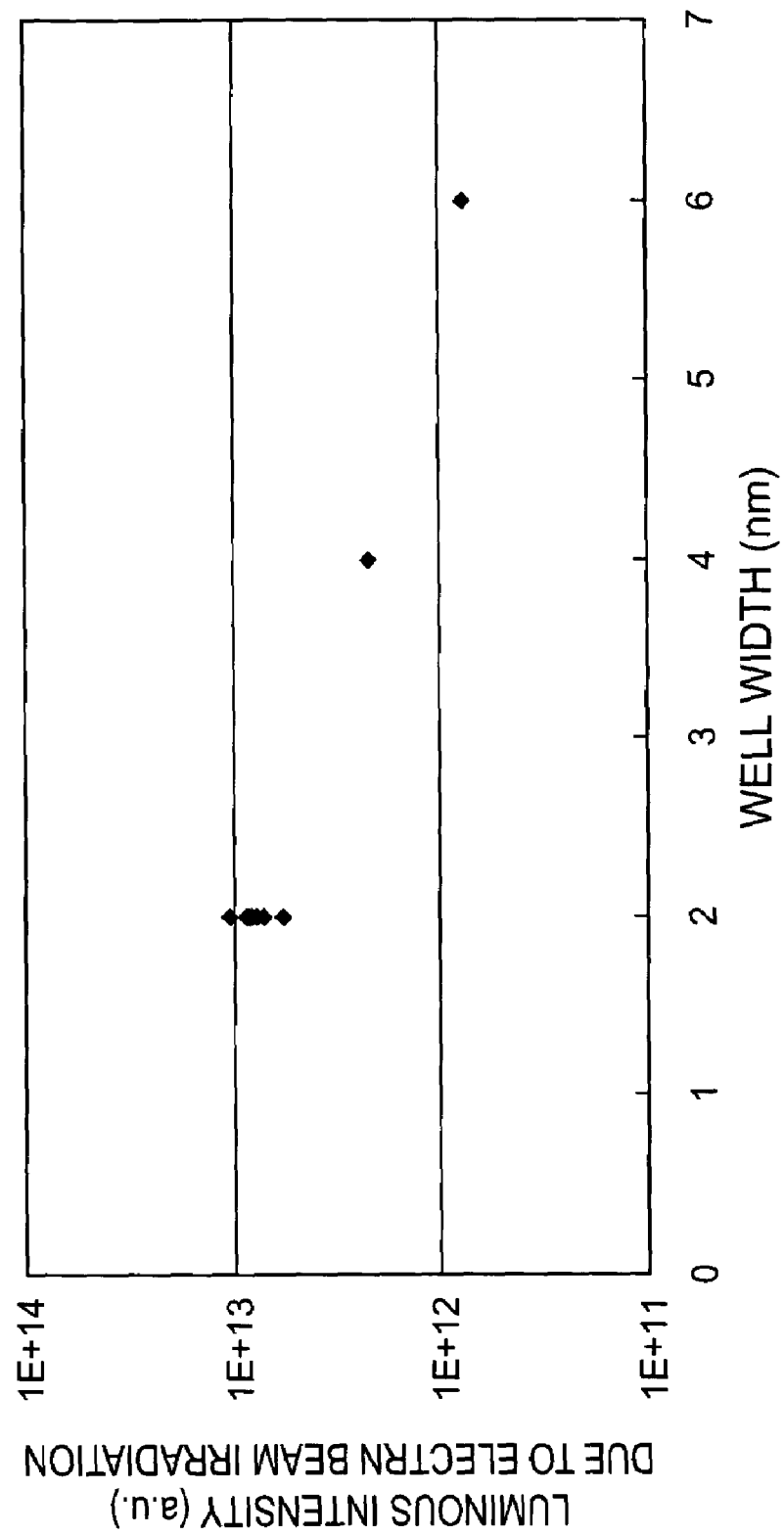
FIG. 19 is a graph showing the relationship between the well width and the luminous intensity of the illuminant having the quantum well structure of InGaN/GaN.

Here, in the quantum well structure of InGaN/GaN of the nitride semiconductor layer 14, it is preferable that the well width W of the quantum wells is 4 nm or less. Herein, the relationship between the well width W and the CL-intensity of the quantum well structure of InGaN/GaN of the nitride semiconductor layer 14 is shown in FIG. 19. In FIG. 19, the horizontal axis shows the well width W (nm), and the vertical axis shows the luminous intensity (in arbitrary units) when an electron beam with a predetermined intensity is irradiated. From FIG. 19, it can be understood that although the luminous intensity is lower than $1\times10^{12}$ in the case where the well width W is 6 nm, the luminous intensity becomes equal to or higher than $1\times10^{12}$ in all cases where the well width W is 4 nm or less. Namely, by limiting the well width W of the quantum well structure to 4 nm or less, the luminous intensity can be increased to $1\times10^{12}$ or higher, whereby fluorescence appropriate for practical use can be obtained from the illuminant 10.

Also, as the combination of materials of the substrate 12 and the quantum well structure layer 14C, other than sapphire and the InGaN/GaN quantum well structure, other various combinations can be used, and the combinations are described as follows. FIG. 20 is a table showing the transmission wavelengths (nm) and the energy band gaps (eV) of various substrate materials.

The materials shown in FIG. 20 have comparatively short transmission wavelengths, and include a material that transmits any light within the visible light range (for example, AlN).

The material of the quantum well structure layer 14C can be properly selected among nitride semiconductors having quantum well structures composed of $In_xAl_yGa_{1-x-y}N$ ($x\leq1$, $y\leq1$, $x+y\leq1$) and $In_aAl_bGa_{1-a-b}N$ ($a\leq1$, $b\leq1$, $a+b\leq1$). Therefore, other than the above quantum well structure layer 14C (the combination of InGaN/GaN), for example, the combination of InGaN/AlGaN, InGaN/InGaN, or GaN/AlGaN is also possible.

In the above combinations of the substrate material and the quantum well structure layer material, it is necessary that the wavelength of fluorescence emitted from the quantum well structure layer 14C is longer than the transmission wavelength of the substrate 12. Namely, by selecting a substrate material having a transmission wavelength shorter than the wavelength of fluorescence emitted from the quantum well structure layer 14C or by selecting a material of a quantum well structure layer 14C which emits fluorescence with a wavelength longer than the transmission wavelength of the substrate 12, fluorescence is emitted from the substrate rear surface 12b.

Next, the electron beam detector 20 in which the illuminant 10 has been applied (electron beam detector according to the present invention) will be explained.

Figure 21:
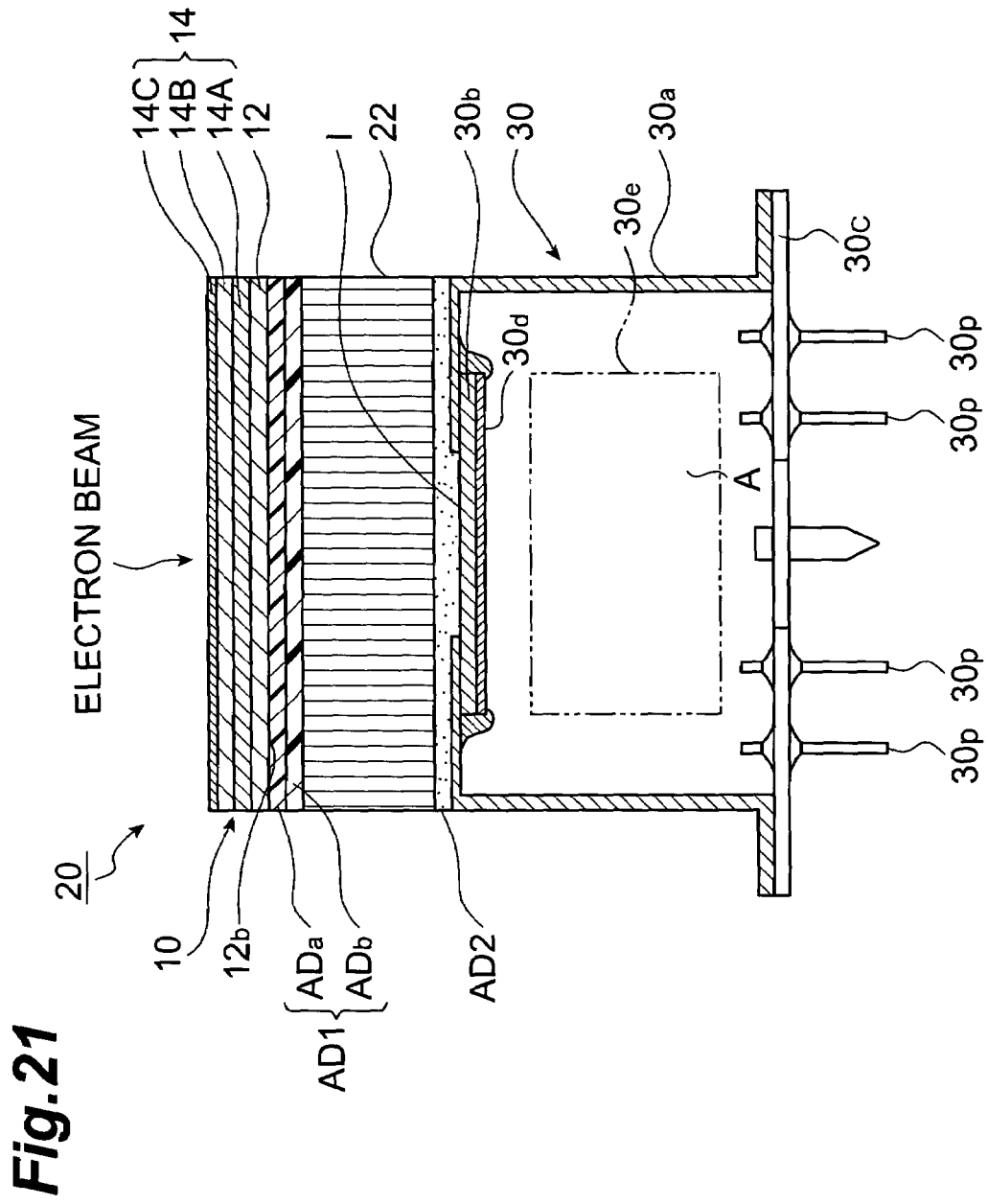
FIG. 21 is a sectional view showing the construction of an embodiment of the electron beam detector according to the present invention.

FIG. 21 is a sectional view showing the construction of an embodiment of the electron beam detector according to the present invention. In the electron beam detector 20, the illuminant 10 that converts incident electrons into fluorescence and the light entrance surface I are optically combined via an optical member (optical guide member) 22. In the electron beam detector 20, the illuminant 10 and the photodetector 30 are physically connected via the optical member 22 and integrated. In greater detail, the optical member 22 made from a fluorescence-permeable material is affixed to the light entrance surface I, and the illuminant 10 is attached to the optical member 22. The optical member 22 is a light guide such as a fiber optic plate (FOP), etc., and other than this, it may be a lens that condenses fluorescence emitted from the illuminant 10 to the light entrance surface I.

Between the optical member 22 and the photodetector 30, a fluorescence-permeable adhesive layer (adhesive: resin) AD2 is interpolated, and the relative positions of the optical member 22 and the photodetector 10 are fixed by the adhesive layer AD2.

The optical member 22 is a glass plate, an SiN layer ADa and an $SiO_2$ layer ADb are formed on the substrate rear surface 12b of the illuminant 10, and the $SiO_2$ layer ADb and the glass plate of the optical member 22 are fusion-bonded each other. Both the $SiO_2$ layer ADb and glass plate are made from silicon oxide, so that they are fusion-bonded each other by being heated. The $SiO_2$ layer ADb is formed on the SiN layer ADa by using sputtering, and the bonding strength between these is also great.

The SiN layer ADa is also formed on the surface of the illuminant 10 by sputtering, and the bonding strength between these is also high, and as a result, the adhesive layer AD1 affixes the illuminant 10 to the optical member 22. Also, the SiN layer ADa also serves as an antireflection film, and the SiN layer ADa suppresses reflection of fluorescence generated inside the illuminant 10 in accordance with incidence of an electron beam toward the illuminant 10. General refractive indexes of the respective adhesive layers AD1 and AD2 are 1.5.

In the electron beam detector 20 thus structured, fluorescence generated inside the illuminant 10 in accordance with the incidence of an electron beam is made incident on the optical member 2 via the adhesive layer AD1 made from a fluorescence-permeable material, successively passes through the optical member 2 and the adhesive layer AD2, and reaches the plane of light incidence I of the photodetector 30.

The photodetector 30 shown in FIG. 21 is a photomultiplier. The photodetector 30 comprises a metal tube 30a, a light entrance window (surface plate) 30b for closing the opening at the top of the tube 30a, and a vacuum vessel formed of a stem plate 30c for closing the opening at the bottom of the tube 30a. Inside the vacuum vessel, a photocathode 30d formed on the inner surface of the light entrance window 30b, an electron multiplier section 30e, and an anode A are arranged.

The light entrance surface I corresponds to the outside surface of the light entrance window 30b, and fluorescence that has been made incident on the light entrance surface I passes through the light entrance window 30b and made incident on the photocathode 30d, and the photocathode 30d emits photoelectrons toward the inside of the vacuum vessel in response to fluorescent incidence (photoelectric conversion). The electrons are multiplied by the electron multiplier section 30e that is formed of a micro channel plate or a mesh dynode, and collected at the anode A.

The electrons collected at the anode A are extracted to the outside of the photodetector 30 via pins 30p that penetrate the stem plate 30c. The number of pins 30p is plural, and a predetermined potential is applied to the electron multiplier section 30e via each pin 30p. Furthermore, the electrical potential of the metal bypass 30a is 0V, and the photocathode 30d is electrically connected to the tube 30a.

The abovementioned electron beam detector 20 is applicable to a scanning electron microscope (SEM) and a mass spectroscope.

Figure 22:
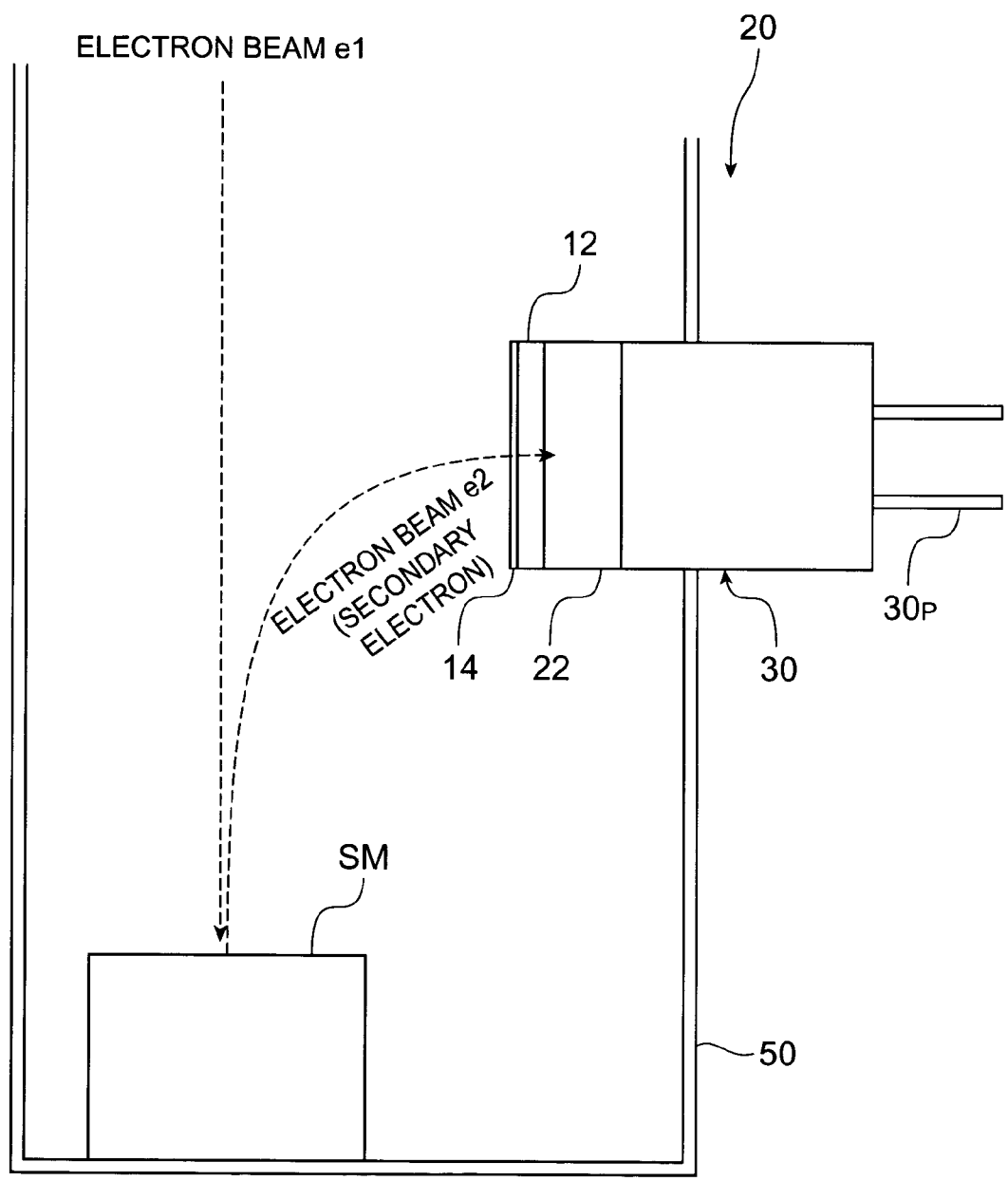
FIG. 22 is a diagram showing the construction of a scanning electron microscope in which the electron beam detector shown in FIG. 21 has been applied (scanning electron microscope according to the present invention)

FIG. 22 shows the construction of the major portion of a scanning electron microscope according to the present invention. The scanning electron microscope comprises the electron beam detector 20. When the surface of a sample SM is scanned while irradiating the sample SM with an electron beam e1, secondary electrons are emitted from the surface of the sample SM, and are guided to the electron beam detector 20 as an electron beam e2. At the electron beam detector 20, an electrical signal is outputted from the pins 30p in accordance with incidence of the electron beam e2.

Namely, the scanning electron microscope comprises at least the illuminant 10 of the electron beam detector 20 inside a vacuum chamber 50. In the scanning electron microscope, secondary electrons are generated from the sample SM by scanning the surface of the sample SM set inside the vacuum chamber 50 with the electron beam e1, and the secondary electrons are guided to the electron beam detector 20. Namely, the scanning electron microscope is a device which images the sample SM by synchronizing the scanning position of the electron beam e1 and the output of the electron beam detector 20. In the scanning electron microscope in which the electron microscope 20 has been applied, the response speed of the illuminant 10 of the electron beam detector 20 is high on the order of nanoseconds, so that it is possible to significantly improve the scanning speed.

Figure 23:
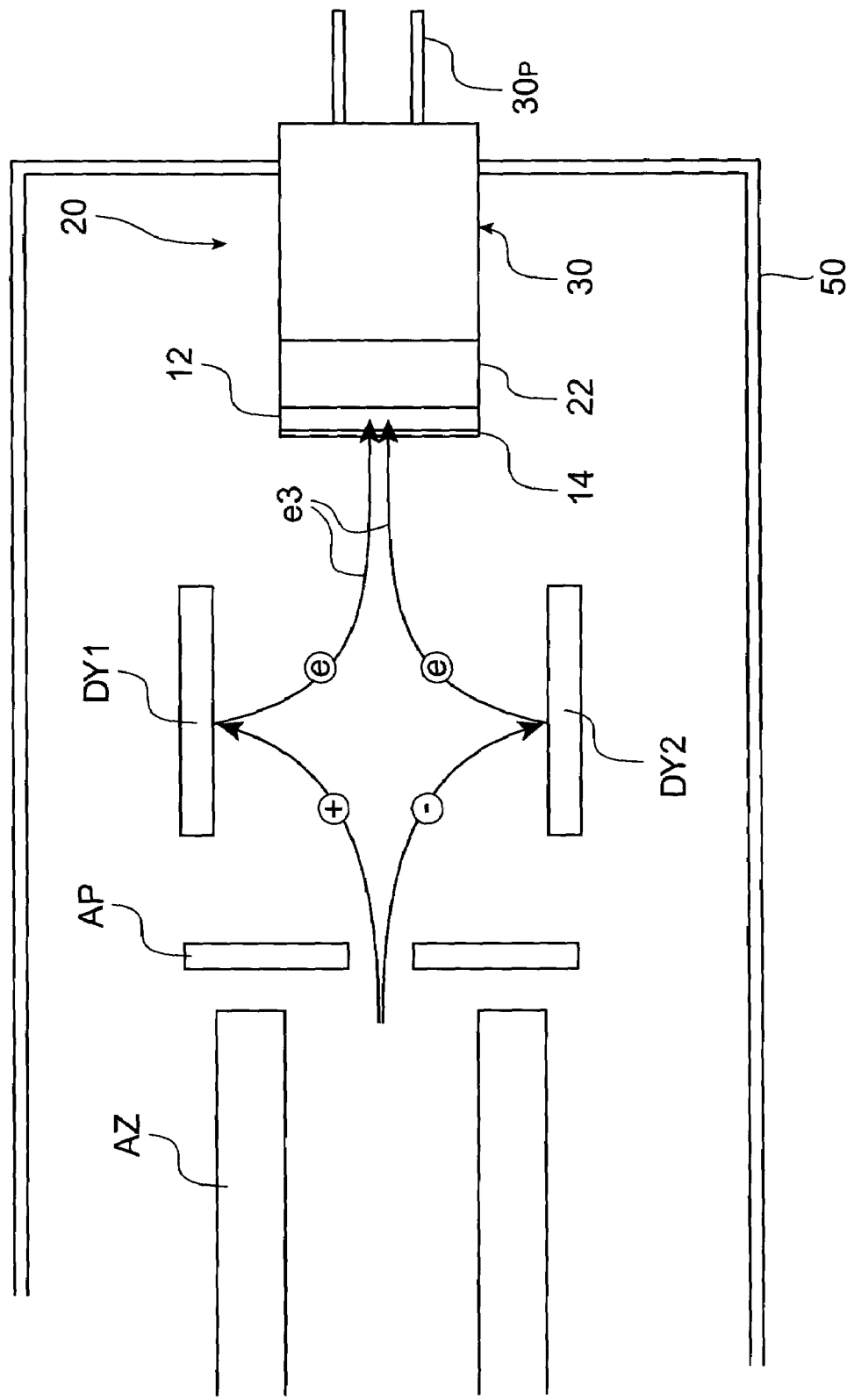
FIG. 23 is a diagram showing the construction of a mass spectroscope in which the electron beam detector shown in FIG. 21 has been applied (mass spectroscope according to the present invention).

FIG. 23 shows the construction of the major portion of a mass spectroscope according to the present invention.

The mass spectroscope comprises the electron beam detector 20. When an appropriate potential is applied to an aperture AP and a negative potential is applied to a first dynode DY1 positioned at the opposite side of a separating section AZ with respect to the aperture AP, cations positioned inside the separating section AZ pass through the aperture AP and collide with the first dynode DY1. In accordance with this collision, secondary electrons are emitted from the surface of the first dynode DY1, and guided as an electron beam e3 to the electron beam detector 20.

A positive potential is applied to a second dynode DY2, and in a case where negative ions are extracted from the separating section AZ, the negative ions collide with the second dynode DY2. In accordance with this collision, secondary electrons are emitted from the surface of the second dynode DY2, and the secondary electrons are guided as an electron beam e3 to the electron beam detector 20. In accordance with incidence of the electron beam e3, an electrical signal is outputted from the pins 30p.

There are various types of mass spectroscopes, and all of them temporally or spatially separate ions by mass.

When it is assumed that the separating section AZ is a fly tube, the time for an ion to pass through the inside of the fly tube differs depending on the mass of the ion, and as a result, the time to reach the dynode DY1 or DY2 differs. Therefore, by monitoring the temporal changes in current value outputted from the pins 30p, the mass of each ion is detected. Namely, the current value shows the ion amounts for respective masses all the time.

When it is assumed that the separating section AZ changes the flying orbit of each ion by means of magnetic fields in accordance with the ion mass, ions that pass through the aperture AP differ by mass. Therefore, by monitoring the temporal changes in current value outputted from the pins 30p, the masses of respective ions are detected. Namely, by sweeping the magnetic flux density or by scanning the position of the aperture AP, the current value thereof shows the ion amounts for respective masses all the time.

As mentioned above, the above mass spectroscope comprises the vacuum chamber 50 in which at least a compound semiconductor substrate 1 in the electron beam detector 20 is disposed, the separating section AZ that spatially or temporally separates ions generated from the sample inside the vacuum chamber 50 in accordance with their masses, and the dynodes DY1 and DY2 to be irradiated with the ions separated at the separating section AZ. Secondary electrons e3 generated from the dynodes DY1 and DY2 in accordance with incidence of ions to the dynodes DY1 and DY2 are guided to the electron beam detector 20, and based on the output of the electron beam detector 20, mass spectroscopy of the sample is carried out. Thus, in a mass spectroscope in which the electron beam detector 20 has been applied, since the response speed of the illuminant 10 in the electron beam detector 20 is high on the order of nanoseconds, it is possible to significantly improve the mass resolution.

Furthermore, the present invention is not limited to the abovementioned embodiments, and may be variously altered. For example, the nitride semiconductor layer 14 may have the quantum well structure partially or have the quantum well structure entirely. In addition, the photodetector 30 may be, for example, an avalanche photodiode (APD) in place of the photomultiplier. Also, the shape of the optical member is not limited to the linear shape, and may be a rounded form, and the size may also be changeable suitably.

As described above, in accordance with the invention, an illuminant that realizes a high response speed and a high luminous intensity and is applicable to electronics devices such as electron beam detectors, scanning electron microscopes and mass spectroscopes.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An illuminant which converts incident electrons into fluorescence, comprising:
    an entrance surface for taking the incident electrons into said illuminant;
    an emitting surface for outputting at least part of the fluorescence converted from the incident electrons in said illuminant, said emitting surface opposing said entrance surface;
    a substrate being transparent with respect to the fluorescence and having a first surface and a second surface that opposes said first surface and that corresponds to said emitting surface; and
    a nitride semiconductor layer provided on and in direct contact with said first surface of said substrate while covering said entire first surface of said substrate, said nitride semiconductor layer including a quantum well structure that emits fluorescence in response to the electron incidence having passed through said entrance surface.

2. An illuminant according to claim 1, wherein the well width of said quantum well structure is 4 nm or less.

3. An electron beam detector comprising:
    an illuminant according to claim 1; and
    a photodetector having a sensitivity for fluorescence emitted from said illuminant.

4. A scanning electron microscope comprising:
    an electron beam detector including a illuminant according to claim 1 and a photodetector having a sensitivity with respect to fluorescence emitted from said illuminant; and a vacuum chamber including at least said illuminant installed inside, wherein said scanning electron microscope guides secondary electrons, which are generated from a sample disposed inside said vacuum chamber by scanning the surface of the sample with an electron beam, to said electron beam detector and takes an image of the sample by making correspondence between the scanning position of the sample and the output of said electron beam detector.

5. A scanning electron microscope according to claim 4, wherein the well width of said quantum well structure in said illuminant is 4 nm or less.

6. A mass spectroscope comprising:

an electron beam detector including an illuminant according to claim 1 and a photodetector having a sensitivity for fluorescence emitted from said illuminant;

a vacuum chamber including at least said illuminant installed inside;

a separating section which spatially or temporally separates ions generated from a sample inside said vacuum chamber in accordance with masses of the ions; and a dynode to be irradiated with ions that have been separated at said separating section, wherein said mass spectroscope guides secondary electrons, which are generated from said dynode in accordance with the incidence of ions onto said dynode, to said electron beam detector, and carries out mass spectroscopy of the sample based on the output of said electron beam detector.

7. A mass spectroscope according to claim 6, wherein the well width of said quantum well structure in said illuminant is 4 nm or less.

8. An illuminant according to claim 1, wherein said quantum well structure is arranged so as to cover said entire first surface of said substrate.

* * * * *